(12) United States Patent
Lu et al.

(10) Patent No.: US 10,288,494 B2
(45) Date of Patent: May 14, 2019

(54) MTJ-BASED TEMPERATURE-SENSING DEVICE

(71) Applicant: Taiwan Semiconductor Manufacturing Co., Ltd., Hsin-Chu (TW)

(72) Inventors: Shih-Lien Linus Lu, Hsinchu (TW); Chia-Fu Lee, Hsinchu (TW); Yi-Chun Shih, Taipei (TW); Chung-Cheng Chou, Hsin-Chu (TW); Yu-Der Chih, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 126 days.

(21) Appl. No.: 15/591,976

(22) Filed: May 10, 2017

(65) Prior Publication Data

US 2018/0149527 A1  May 31, 2018

Related U.S. Application Data

(60) Provisional application No. 62/428,400, filed on Nov. 30, 2016.

(51) Int. Cl.
*G01K 7/36* (2006.01)
*H01L 27/22* (2006.01)
(Continued)

(52) U.S. Cl.
CPC ............... *G01K 7/36* (2013.01); *G01K 7/01* (2013.01); *G01K 7/16* (2013.01); *H01L 27/228* (2013.01); *H01L 43/02* (2013.01); *H01L 43/08* (2013.01)

(58) Field of Classification Search
CPC ..... G01K 7/36; G01K 7/01; G01K 7/16; H01L 27/228; H01L 43/02; H01L 43/08
See application file for complete search history.

(56) References Cited

U.S. PATENT DOCUMENTS

| | | | | | |
|---|---|---|---|---|---|
| 4,071,813 | A | * | 1/1978 | Dobkin | G01K 7/01 323/226 |
| 5,228,780 | A | * | 7/1993 | Shepard | G01K 7/30 374/175 |

(Continued)

OTHER PUBLICATIONS

Chatterjee, S. et al., "Impact of Self-Heating on Reliability of a Spin-Torque-Transfer RAM Cell," IEEE Transactions on Electron Devices, 2012,59(3):791-799.

(Continued)

*Primary Examiner* — Harshad R Patel
*Assistant Examiner* — Philip L Cotey
(74) *Attorney, Agent, or Firm* — Duane Morris LLP

(57) ABSTRACT

A thermometer circuit configured to estimate a monitored temperature is disclosed. The circuit includes an adjustable resistor presenting a first resistance value that is temperature-independent and a second resistance value that is temperature-dependent, wherein a first current signal is conducted across the resistor when it presents the first resistance value and a second current signal is conducted across the resistor when it presents the second resistance value; a plurality of gated conductors coupled to the resistor; and a control circuit, coupled to the resistor and the plurality of gated conductors, and configured to selectively deactivate at least one of the plurality of gated conductors to compare the first and second current signals to estimate the monitored temperature.

18 Claims, 16 Drawing Sheets

(51) Int. Cl.
*H01L 43/02* (2006.01)
*H01L 43/08* (2006.01)
*G01K 7/01* (2006.01)
*G01K 7/16* (2006.01)

(56) References Cited

U.S. PATENT DOCUMENTS

| | | | | |
|---|---|---|---|---|
| 7,755,965 | B2* | 7/2010 | Chen | G11C 7/04 365/158 |
| 9,142,277 | B2* | 9/2015 | Kim | G11C 11/1695 |
| 2005/0036362 | A1* | 2/2005 | Iwata | G11C 11/15 365/158 |
| 2005/0216220 | A1* | 9/2005 | Kim | G01K 3/005 702/130 |
| 2005/0254294 | A1* | 11/2005 | Iwata | G11C 11/14 365/171 |
| 2007/0076330 | A1* | 4/2007 | Chung | G01K 7/01 360/324.2 |
| 2007/0077664 | A1* | 4/2007 | Chung | G01K 7/36 438/2 |
| 2007/0158776 | A1* | 7/2007 | Julio | G01K 7/01 257/486 |
| 2008/0084205 | A1* | 4/2008 | Zimmer | B82Y 25/00 324/252 |
| 2009/0268778 | A1* | 10/2009 | Lee | G01K 7/01 374/178 |
| 2010/0161261 | A1* | 6/2010 | Drapkin | G01K 7/01 702/65 |
| 2012/0181651 | A1* | 7/2012 | Jiang | G01K 7/36 257/467 |
| 2013/0070805 | A1* | 3/2013 | Coln | G01K 7/186 374/1 |
| 2013/0341581 | A1* | 12/2013 | Ritter | H01L 45/12 257/2 |
| 2014/0064322 | A1* | 3/2014 | Maksymovych | G01K 7/01 374/15 |
| 2014/0098600 | A1* | 4/2014 | Kim | G11C 11/1695 365/158 |
| 2014/0119107 | A1* | 5/2014 | Cha | G11C 11/1673 365/158 |
| 2015/0043266 | A1* | 2/2015 | Youn | G11C 13/0021 365/148 |
| 2015/0145504 | A1* | 5/2015 | Bai | G01P 3/488 324/207.13 |
| 2015/0262639 | A1* | 9/2015 | Fujita | G11C 11/1675 365/158 |
| 2016/0049185 | A1* | 2/2016 | Lu | G11C 11/1659 365/158 |

OTHER PUBLICATIONS

Pushp, A. et al., "Giant thermal spin-torque-assisted magnetic tunnel junction switching," PNAS, 2015, 112(21):6585-6590.

Chatterjee, S. et al., "Electrothermal Analysis of Spin-Transfer-Torque Random Access Memory Arrays", ACM Journal on Emerging Technologies in Computing Systems, May 2013, 9(2):15:1-15:17.

* cited by examiner

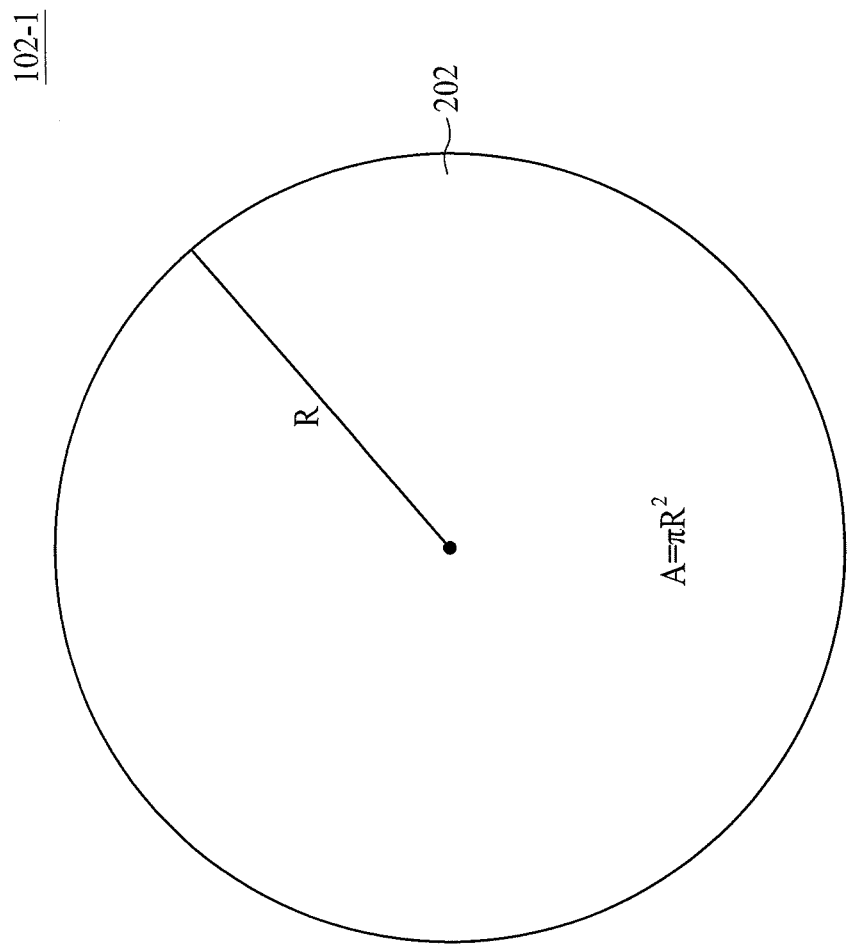

MTJ-BASED TEMPERATURE-SENSING DEVICE

CROSS-REFERENCE TO RELATED APPLICATION

The present application claims priority to U.S. Provisional Patent Application No. 62/428,400, filed on Nov. 30, 2016, which is incorporated by reference herein in its entirety.

BACKGROUND

Aggressive technology scaling for high performance integrated circuits has resulted in higher current densities in interconnection lines, which in turn increases power dissipation on a respective substrate. Generally, a significant amount of such dissipated power converts to heat, which thus causes a substantial rise in heat density. Respective different operation modes of each of the functional blocks in a high performance integrated circuit cause temperature gradients on the substrate where the integrated circuit is formed. The above-mentioned scenarios provide a need for a lightweight, robust, and power-efficient on-chip temperature-sensing device that can be used for accurate thermal mapping and thermal management.

To satisfy such needs, a variety of on-chip temperature-sensing devices have been proposed over the years such as, for example, an on-chip thermal sensor. In general, an on-chip thermal sensor is an integral part of an integrated circuit that provides one or more additional layers of protection. The on-chip thermal sensor can be used to detect whether the integrated circuit is being hacked, for example, by sensing a presence of an abnormal temperature. As such, the integrated circuit's security protection can be improved. The on-chip thermal sensor can also be used to provide feedback to other on-chip circuits/components so as to allow those on-chip circuits/components to adjust respective circuit parameter(s) for not generating excessive heat dissipation. Accordingly, the whole integrated circuit (system) can operate more efficiently and reliably.

Conventional on-chip thermal sensors typically utilize a variety of temperature-varying physical effects (e.g., voltage) to detect/measure temperature. Such conventional thermal sensors are subjected to a variety of issues when integrated into an integrated circuit. In an example, one or more diodes (p-n junction devices) are used to measure temperature by comparing respective voltage drops based on a temperature-varying characteristic of the voltage drop. However, integrating the diodes into an integrated circuit typically encounters a variety of issues, e.g., re-allocation of real estate to accommodate the diode(s), high power consumption of the diode(s), etc. In another example, a metal-oxide-semiconductor (MOS) transistor is used as an on-chip thermal sensor by using the MOS transistor's temperature-varying threshold voltage. Although such MOS-based thermal sensors are relatively smaller in size and have lower power consumption, integrating the MOS-based thermal sensors into an integrated circuit still encounters a variety of issues such as, for example, difficulty in scaling with other on-chip components/circuits of the integrated circuit. Thus, conventional on-chip thermal sensors are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions of the various features may be arbitrarily increased or reduced for clarity of discussion.

FIG. 2B illustrates a top view of the magnetic tunnel junction (MTJ) cell of the temperature-sensing device of FIG. 1, in accordance with some embodiments.

DETAILED DESCRIPTION OF EXEMPLARY EMBODIMENTS

Figure 1:
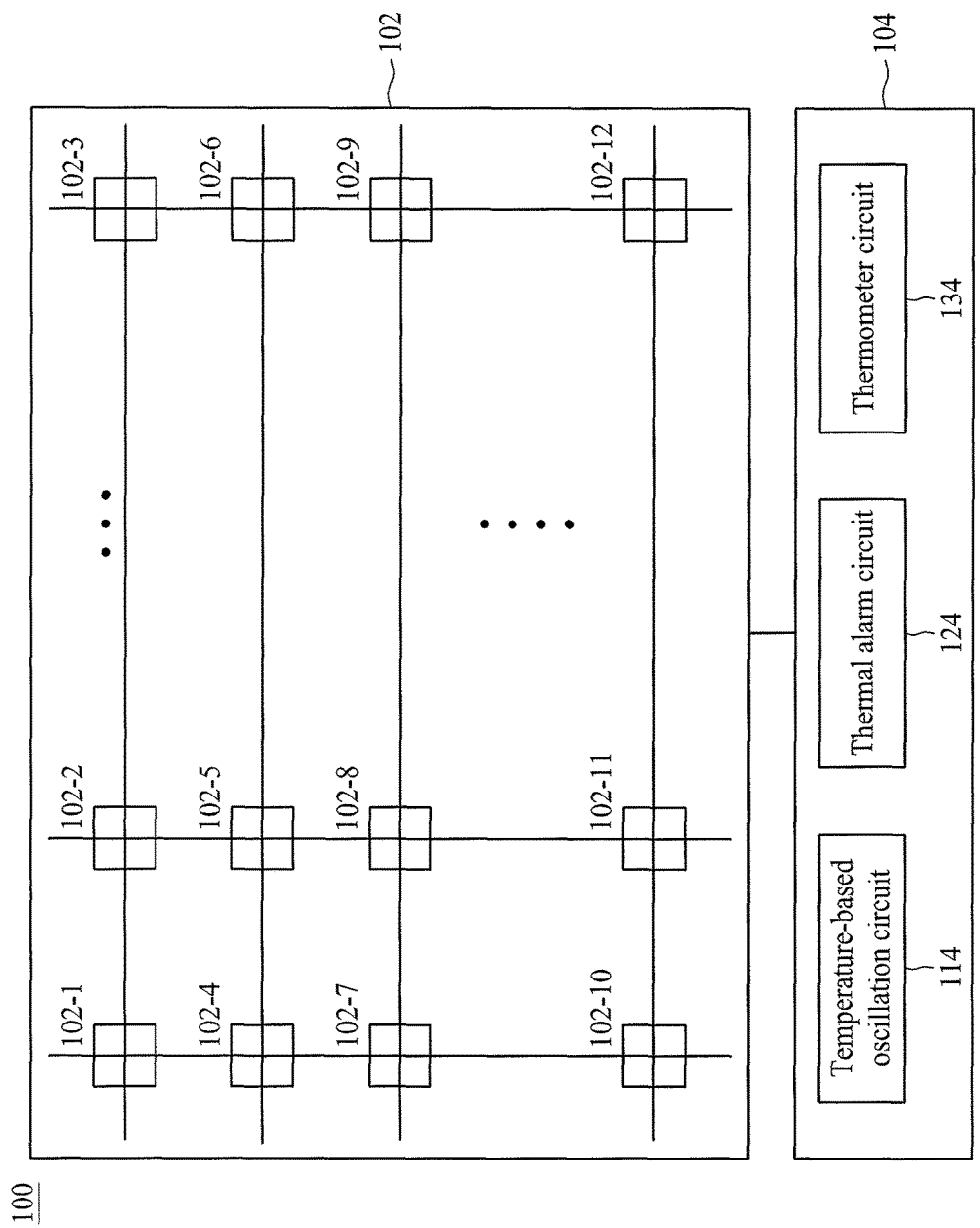
FIG. 1 illustrates an exemplary block diagram of a temperature-sensing device, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

The present disclosure provides various embodiments of a temperature-sensing device including one or more magnetic tunnel junction (MTJ) cells. In some embodiments, the disclosed temperature-sensing device may be integrated into a system circuit (e.g., a system-on-chip (SoC) circuit, system-in-package (SiP), etc.) as part of an embedded non-volatile memory (eNVM) circuit. That is, the disclosed temperature-sensing device may be part of the eNVM circuit of the system circuit. In some embodiments, such an eNVM circuit includes an MTJ array having a plurality of MTJ cells and a peripheral circuit coupled to the MTJ array.

According to some embodiments of the present disclosure, the temperature-sensing device uses one or more MTJ cells of the MTJ array and respective circuit components of the peripheral circuit to monitor temperatures of the system circuit. As will be discussed in further detail below with respect to FIG. 2A, in some embodiments, each MTJ cell may be selected (written) to be in either a parallel state (hereinafter "P state") or an anti-parallel state (hereinafter "AP state") in response to a polarity of an external current/voltage source.

In some embodiments, when the MTJ cell is in the P state, the MTJ cell presents a temperature-independent resistance value; and when the MTJ cell is in the AP state, the MTJ cell presents a temperature-dependent resistance value. In general, the temperature-independent resistance value remains substantially constant over varying temperatures, and the temperature-dependent resistance value changes in accordance with the varying temperatures. Also, the substantially constant temperature-independent resistance value is typically smaller than the temperature-dependent resistance value(s), which allows the MTJ cells to be used as an adjustable resistor that can also reflect a temperature change.

By using such a selectable temperature-dependent/independent resistance value of the MTJ cell and together with respective circuit components, the disclosed temperature-sensing device can be used in a variety of temperature-related applications such as, for example, a temperature-based oscillator, a thermal alarm, a thermometer, etc. Further, since the disclosed temperature-sensing device uses the MTJ cells and the respective circuit components that have been already integrated as part of the system circuit, the disclosed temperature-sensing device may avoid the issues that the conventional on-chip thermal sensors encounter, e.g., re-allocation of real estate, additional power consumption, scalability, etc.

FIG. 1 illustrates an exemplary block diagram of a temperature-sensing device 100, in accordance with various embodiments. The temperature-sensing device 100 is configured to perform on-chip temperature sensing on a system circuit (and/or the system circuit's on-chip circuits/components) into which the temperature-sensing device 100 is integrated. In some embodiments, the temperature-sensing device 100 may dynamically monitor an on-chip temperature. In some embodiments, the temperature-sensing device 100 may further estimate a reading of the on-chip temperature.

As shown in FIG. 1, the temperature-sensing device 100 includes a memory array 102 and a peripheral circuit 104 coupled to the memory array 102. As mentioned above, in some embodiments, the temperature-sensing device 100 may be implemented as an embedded non-volatile memory (eNVM) circuit, and such an eNVM circuit may be an on-chip memory circuit of a system circuit (e.g., a system-on-chip (SoC)). The term "on-chip" as used herein refers to a circuit (e.g., the temperature-sensing device 100) being integrated into a larger system circuit, and the whole system circuit is fabricated on a single chip.

In some embodiments, the memory array 102 may include a magnetoresistive random-access memory (MRAM) array. Specifically, the memory array 102 includes a plurality of magnetic tunnel junction (MTJ) memory cells (hereinafter "MTJ cells"), e.g., 102-1, 102-2, 102-3, 102-4, 102-5, 102-6, 102-7, 102-8, 102-9, 102-10, 102-11, 102-12, etc., that are arranged in a column-row configuration. Although the illustrated embodiment of FIG. 1 shows twelve MTJ cells, it is understood that any desired number of MTJ cells can be included in the memory array 102. Further, in some embodiments, the plurality of MTJ cells are laid out to be coupled to one another through respective bit lines (BL's), source lines (SL's), and word lines (WL's). Details of the MTJ cell (e.g., 102-1~102-12) and the layout of the MTJ array (e.g., 102) will be discussed further in FIGS. 2A and 4A, respectively.

In some embodiments, the peripheral circuit 104 includes a variety of sub-circuits. For example, the sub-circuits of the peripheral circuit 104 may include a temperature-based oscillation circuit 114, a thermal alarm circuit 124, and a thermometer circuit 134. Each of the sub-circuits (114, 124, and 134) may be coupled to or include one or more MTJ cells (e.g., 102-1~102-12), which will be respectively discussed in further detail below. The temperature-based oscillation circuit 114, which will be discussed in further detail below with respect to FIGS. 3A, 3B, 3C, 3D, 3E, and 3F, is configured to utilize a ring of serially coupled MTJ cells that are each respectively written to the AP state so as to provide a temperature-dependent oscillation frequency, and use such a temperature-dependent oscillation frequency to estimate a temperature reading of an on-chip temperature. The thermal alarm circuit 124, which will be discussed in further detail below with respect to FIGS. 4A and 4B, is configured to activate an alarm signal when detecting either an above-threshold on-chip temperature based on a "read failure" or a below-threshold on-chip temperature based on a "write failure." The thermometer circuit 134, which will be discussed in further detail below with respect to FIGS. 5A, 5B, 5C, 5D, and 6, is configured to estimate a temperature reading of an on-chip temperature using at least one coupled MTJ cell being written to the AP state.

Figure 2A:
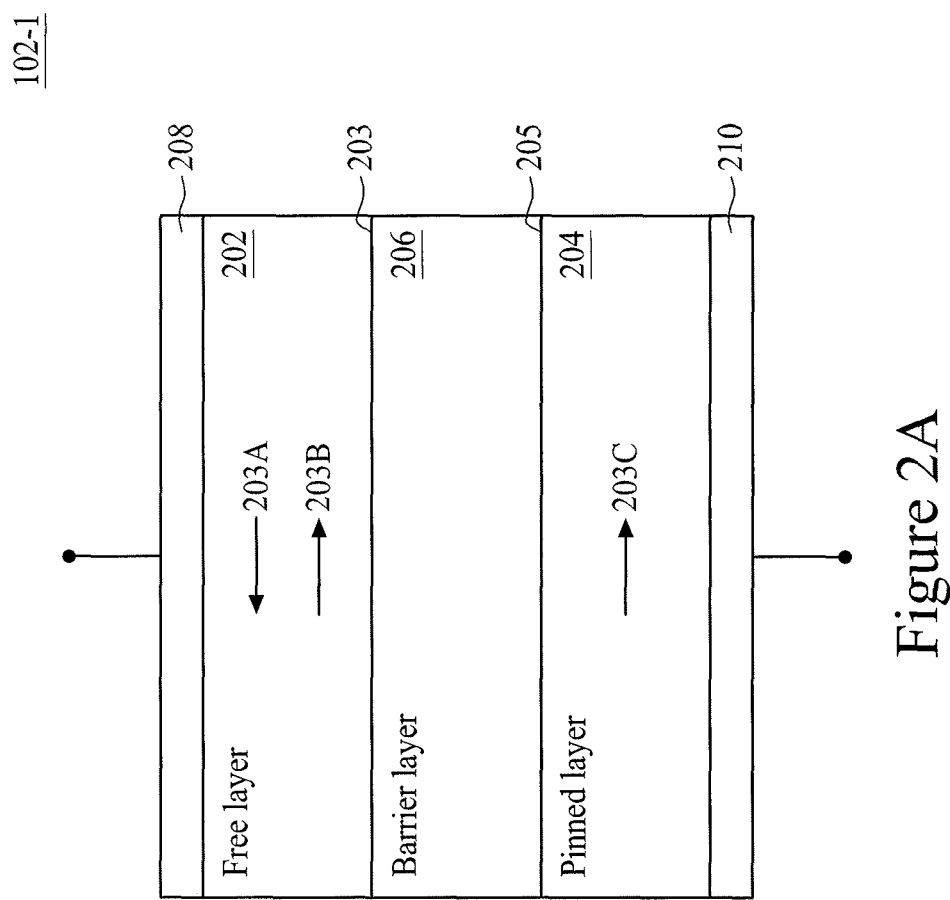
FIG. 2A illustrates a cross-sectional view of a magnetic tunnel junction (MTJ) cell of the temperature-sensing device of FIG. 1, in accordance with some embodiments.

Referring now to FIG. 2A, a cross-sectional view of an exemplary schematic structure of an MTJ cell of the MTJ array 102 is shown, in accordance with some embodiments. Since the MTJ cells of the MTJ array 102 are substantially similar to one another, the following discussion is directed to the MTJ cell 102-1. As shown, the MTJ cell 102-1 includes a free layer 202, a pinned layer 204, and a barrier layer 206 sandwiched therebetween. In some embodiments, the free and pinned layers 202 and 204 are ferromagnetic layers (i.e., formed of one or more ferromagnetic materials such as, Fe, Co, or the like), and are covered by electrode layers 208 and 210, respectively. The barrier layer 206 is formed of aluminum oxide ($Al_2O_3$), magnesium oxide (MgO), germanium oxide (GeO), or the like.

The term "free" as used herein refers to a layer such as free layer 202, which has varying directions of magnetizations (e.g., 203A or 203B). Conversely, the term "pinned" as used herein refers to a layer such as the pinned layer 204, which has a fixed direction of magnetization (e.g., 203C). When a sufficiently large positive voltage (or a sufficiently large current signal) is applied across the MTJ cell 102-1 from the end of the pinned layer 204, a tunneling process occurs across the barrier layer 206, which causes the magnetization directions of the free layer 202 and the pinned layer 204 to be opposite to each other, i.e., the free layer 302 having the magnetization direction 203A. On the other hand, when a sufficiently large positive voltage (or a sufficiently large current signal) is applied across the MTJ cell 102-1 from the end of the free layer 202, another tunneling process occurs across the barrier layer 206, which causes the magnetization directions of the free layer 202 and the pinned layer 204 to be identical to each other, i.e., the free layer 202 having the magnetization direction 203B.

More specifically, in some embodiments, when a free layer and a pinned layer of an MTJ cell have opposite magnetization directions, the MTJ cell is typically referred as being (written) in the above-mentioned "anti-parallel" (AP) state; and when a free layer and a pinned layer of an MTJ cell have a same magnetization direction, the MTJ cell is typically referred as being (written) in the above-mentioned "parallel" (P) state. When the MTJ cell is in the AP state, the MTJ cell may present a less conductive behavior (i.e., having a higher resistance value); and when the MTJ cell is in the P state, the MTJ cell may present a more conductive behavior (i.e., having a lower resistance value). Moreover, when the MTJ cell is in the AP state, such a higher resistance value is temperature-dependent. In contrast, when the MTJ cell is in the P state, such a lower resistance value is substantially temperature-independent.

In a non-limiting example, at 75° C., an MTJ cell may have resistance values of about 5.8 kΩ and about 2.5 kΩ when being written to the AP state and P state, respectively; and at 105° C., the MTJ cell may have resistance values of about 5 kΩ and still about 2.5 kΩ when being written to the AP state and P state, respectively. In the above example, it is noted that with an increase of the temperature (e.g., from 75° C. to 105° C.), the MTJ cell presents a corresponding decrease in its resistance value (e.g., from 5.8 kΩ 5 kΩ) when being written in the AP state. On the other hand, when being written in the P state, the resistance value of the MTJ cell is substantially unchanged (e.g., remaining at about 2.5 kΩ) in response to the increase of the temperature.

Although the illustrated embodiment of FIG. 2A shows the magnetization directions (e.g., 203A, 203B, and 203C) are parallel to interfaces (203 and 205) of the stacked layers (202, 204, and 206), in some other embodiments, the varying magnetization directions (203A and 203B) of the free layer 202 and the fixed magnetization direction 203C may be perpendicular to the interfaces (203 and 205). Such perpendicular magnetization directions may be provided by forming the free layer 202 and the pinned layer 204 with one or more magnetic materials with magnetocrystalline anisotropy, e.g., a $(Co/Pt)_n$ superlattice.

FIG. 2B illustrates a top view of the exemplary schematic structure of the MTJ cell 102-1, in accordance with various embodiments. As shown, the MTJ cell 102-1 is made in a curvilinear shape (e.g., a circle). However, the MTJ cell 102-1 may be made in any of a variety of shapes (e.g., an octagon, a square (with rounded corners), etc.) while remaining within the scope of the present disclosure. Further to the illustrated embodiment of FIG. 2B, the MTJ cell 102-1 may be made with a radius "R" and accordingly with a cross-sectional area of "$\pi R^2$." In some embodiments, in addition to being written to different states (i.e., the AP state or the P state), the resistance value of the MTJ cell 102-1 may vary with its respective cross-sectional area. For example, the resistance value of the MTJ cell 102-1 is inversely proportional to the respective cross-sectional area.

Figure 3A:
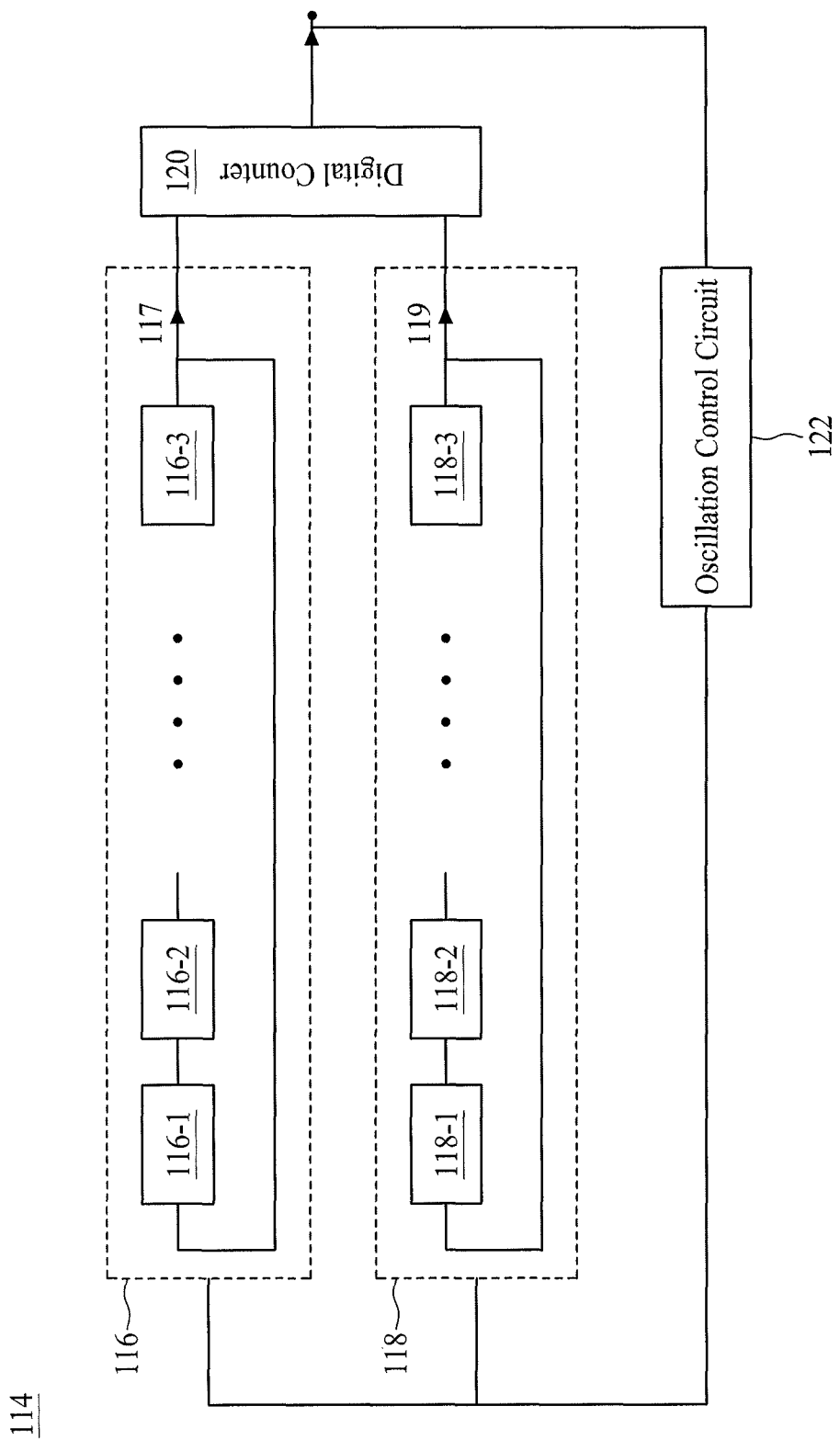
FIG. 3A illustrates an exemplary block diagram of an embodiment of a temperature-based oscillation circuit of the temperature-sensing device of FIG. 1, in accordance with some embodiments.
Figure 4A:
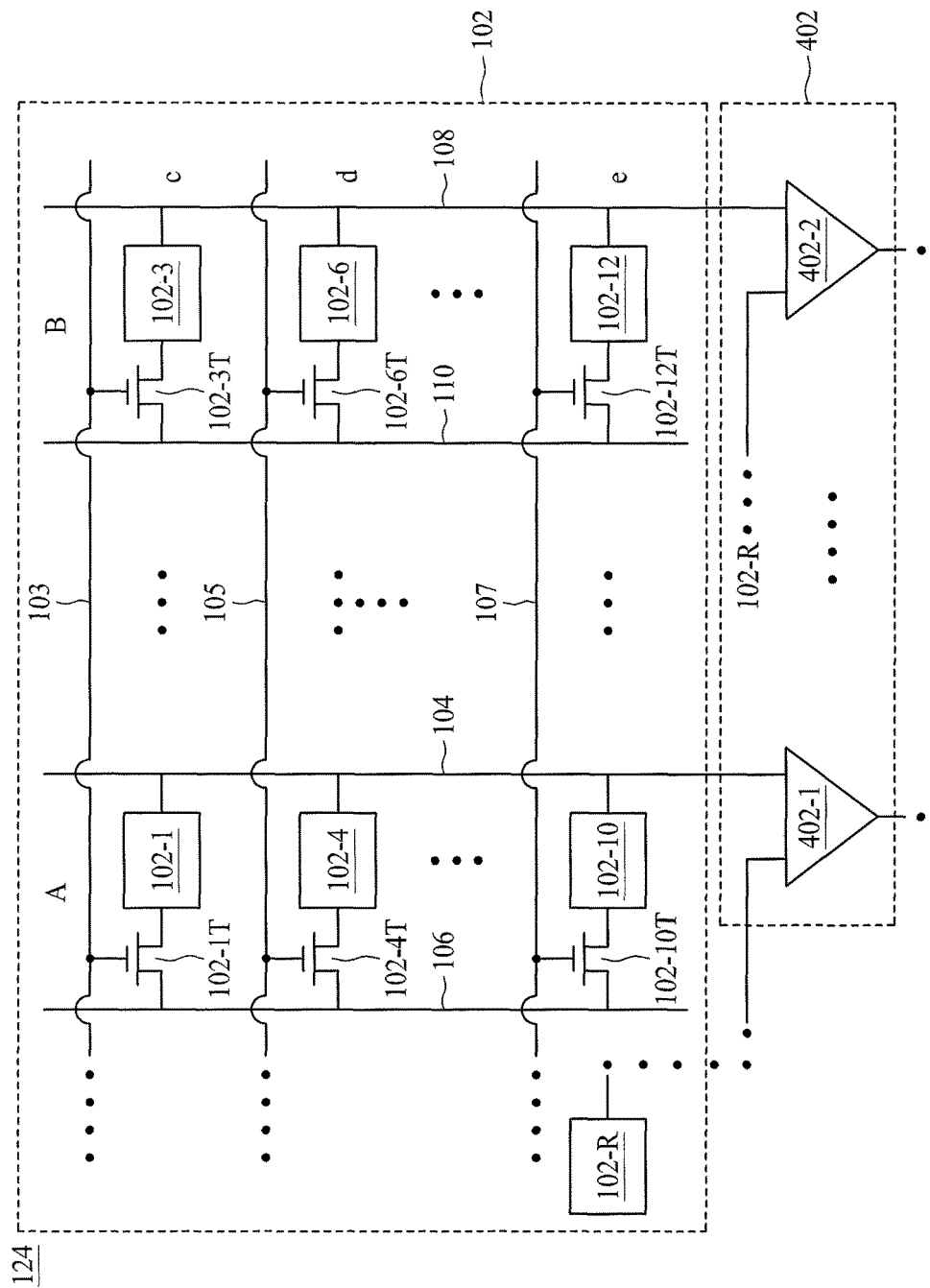
FIG. 4A illustrates an exemplary circuit diagram of part of a thermal alarm circuit of the temperature-sensing device of FIG. 1, in accordance with various embodiments.
Figure 4B:
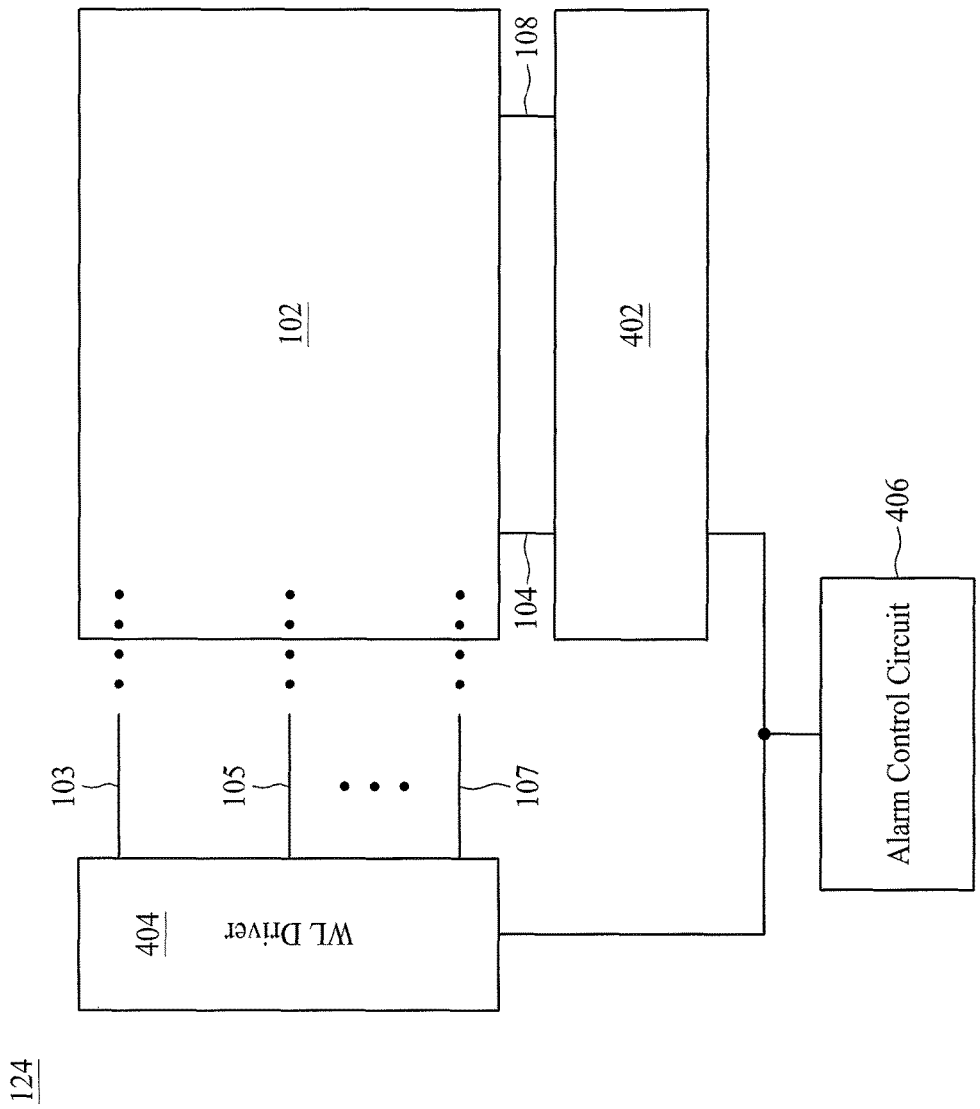
FIG. 4B illustrates an exemplary block diagram of the thermal alarm circuit of the temperature-sensing device of FIG. 1, in accordance with various embodiments.

FIG. 3A illustrates a block diagram of an embodiment of the temperature-based oscillation circuit 114. In some embodiments, the temperature-based oscillation circuit 114 includes a first ring oscillation circuit 116, a second ring oscillation circuit 118, a digital counter 120, and an oscillation control circuit 122. The digital counter 120 is coupled to the first and second ring oscillation circuits 116 and 118. The oscillation control circuit 122 is coupled to the first and second rind oscillation circuits 116 and 118, and the digital counter 120. The oscillation control circuit 122 is configured to control the first and second oscillation circuits 116 and 118, and use the digital counter 120 to estimate a temperature reading, which will be described in further detail below.

The first ring oscillation circuit 116 includes a first odd number of stages/oscillation circuits (e.g., 116-1, 116-2, 116-3, etc.) that are coupled to one another as a first ring; and the second ring oscillation circuit 118 includes a second odd number of stages (e.g., 118-1, 118-2, 118-3, etc.) that are coupled to one another as a second ring. The term "ring" as used herein refers to a ring circuit that includes plural stages serially coupled to one another, and the last stage's output terminal is coupled to the first stage's input terminal thereby forming a ring. Although the illustrated embodiment of FIG. 3A shows only three stages in each of the first and second ring oscillation circuits (116 and 118) (i.e., the first and second odd numbers are three), it should be understood that the first and second odd numbers can each be any desired odd number. Also, the first and second odd numbers may be identical to or different from each other.

It is noted that although the illustrated embodiment of FIG. 1 shows that the temperature-based oscillation circuit 114 is a separate block from the MTJ array 102, in some embodiments, each stage of the first and second ring oscillation circuits 116 and 118, respectively, may include at least one MTJ cell (e.g., 102-1~102-12) of the MTJ array 102. Alternatively stated, the first ring oscillation circuit 116 of the temperature-based oscillation circuit 114 may include a first plurality of the MTJ cells of the MTJ array 102, and the second ring oscillation circuit 118 of the temperature-based oscillation circuit 114 may include a second plurality of the MTJ cells of the MTJ array 102, respectively. Detailed circuit diagrams of the first and second ring oscillation circuits 116 and 118 will be shown and discussed in FIGS. 3B and 3C, respectively.

As discussed above with respect to FIG. 2A, when an MTJ cell is in the P state, the MTJ cell has a resistance value that is temperature-independent; and when the MTJ cell is in the AP state, the MTJ cell has another resistance value that is temperature-dependent. In some embodiments, the first ring oscillation circuit 116 is configured to provide a temperature-dependent frequency by writing the respective MTJ cell at each stage (e.g., 116-1, 116-2, 116-3, etc.) to the AP state so as to cause each MTJ cell of the first ring oscillation circuit 116 to have a temperature-dependent resistance value, and the second ring oscillation circuit 118 is configured to provide a temperature-independent frequency as a reference by writing the respective MTJ cell at each stage (e.g., 118-1, 118-2, 118-3, etc.) to the P state so as to cause each MTJ cell of the second ring oscillation circuit 118 to have a temperature-independent resistance value. Further details of correlations between the temperature-dependent/independent frequencies and the temperature-dependent/independent resistance values of the MTJ cells will be discussed below, respectively. As such, when the temperature-based oscillation circuit 114 is placed in a temperature-varying environment or coupled to a circuit/component with varying temperatures, the digital counter 120 of the temperature-based oscillation circuit 114 may use the reference temperature-independent frequency and the temperature-dependent frequency that changes accordingly with the varying temperatures to estimate a corresponding temperature reading.

Using the temperature-based oscillation circuit 114 to estimate a temperature reading provides various advantages. For example, since the temperature-based oscillation circuit 114 is integrated into a system circuit (as an eNVM circuit) according to some embodiments, the temperature-based oscillation circuit 114 may dynamically monitor a temperature change present on the whole system circuit, or more specifically, on one or more specific circuit components of the system circuit, e.g., a central processing unit (CPU) of the system circuit. And as mentioned above, the temperature change of each circuit component is generally associated with respective power consumption. Thus, the temperature-based oscillation circuit 114 may be used to provide an optimal power management of the system circuit.

Figure 3B:
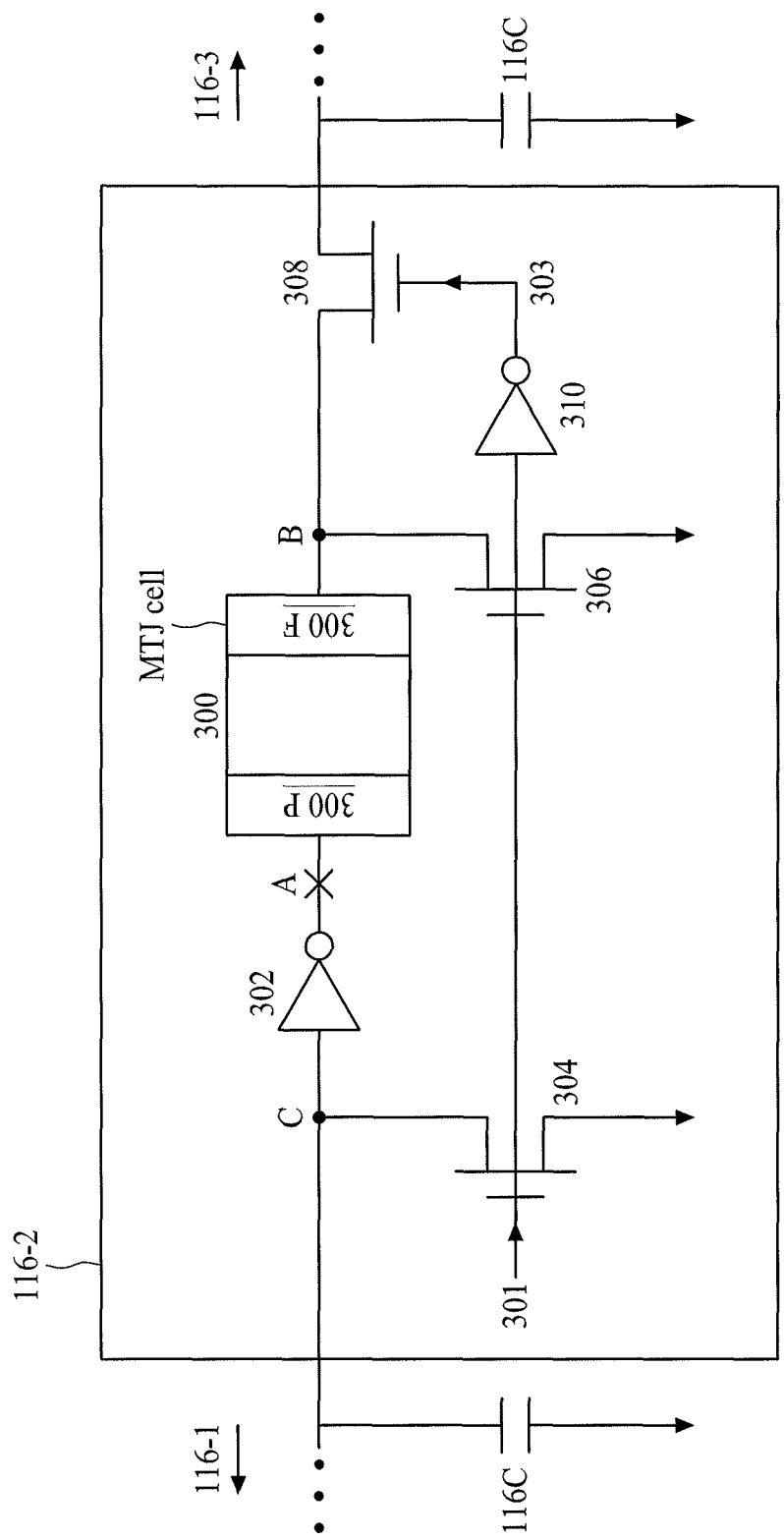
FIG. 3B illustrates an exemplary circuit diagram of a single stage of a first ring oscillation circuit of the temperature-based oscillation circuit of FIG. 3A, in accordance with some embodiments.

Referring now to FIG. 3B, an exemplary circuit diagram of the stage 116-2 of the first ring oscillation circuit 116 (FIG. 3A) is shown, in accordance with various embodiments. In some embodiments, the stages of the first ring oscillation circuit 116 are substantially similar to one another, so the following discussion will be focused on the stage 116-2. For ease of discussion, the stage 116-2 is herein referred to as a current stage of the first oscillation circuit 116, and the neighboring stages 116-1 and 116-3 are herein referred to as a previous stage and a next stage of the first oscillation circuit 116, respectively. Although not shown in FIG. 3A, it is noted that between any neighboring stages of the first ring oscillation circuit 116, at least one capacitor is coupled therebetween, for example, 116C shown in FIG. 3B.

As mentioned above, each stage of the first ring oscillation circuit 116 includes at least one MTJ cell. Accordingly, the stage 116-2 includes a respective MTJ cell 300, and plural circuit components: a first inverter 302, a first switch 304, a second switch 306, a third switch 308, and a second inverter 310. In some embodiments, the first, second, and third switches (304, 306, and 308) are each implemented by an n-type metal-oxide-semiconductor (NMOS) transistor. It is understood that each of the first, second, and third switches (304, 306, and 308) can be implemented by any of a variety of transistors or circuit components (e.g., a bipolar junction transistor (BJT), a transmission gate, etc.).

As described above with respect to FIG. 2A, each MTJ cell includes a pinned layer and a free layer. In the illustrated embodiment of FIG. 3B, the MTJ cell 300's pinned layer 300P and free layer 300F are coupled to an output terminal of the first inverter 302 at node "A" and to a drain end of the NMOS transistor 306 at node "B," respectively. For clarity, the MTJ cell 300's electrodes (e.g., 208 and 210 in FIG. 2A) are not shown in FIG. 3B. Further, the NMOS transistor 304's drain end is coupled to an input terminal of the first inverter 302 at node "C," and the NMOS transistor 304's source end is coupled to ground. The input terminal of the first inverter 302 is coupled to the previous stage of the first ring oscillation circuit 116, e.g., 116-1. The NMOS transistor 304 is gated by a signal 301 (which will be discussed in further detail below). Similarly, the NMOS transistor 306 is also gated by the signal 301 and coupled to ground at the NMOS transistor 306's respective source end. The second inverter 310 is configured to receive the signal 301 and provide a signal 303 logically inverted to the signal 301 to the NMOS transistor 308. The NMOS transistor 308 is gated by such a signal 303. Further, a drain end of the NMOS transistor 308 is coupled to the MTJ cell 300's fixed layer 300F at the node B, and a source end of the NMOS transistor 308 is coupled to the next stage of the first ring oscillation circuit 116, e.g., 116-3.

Figure 3C:
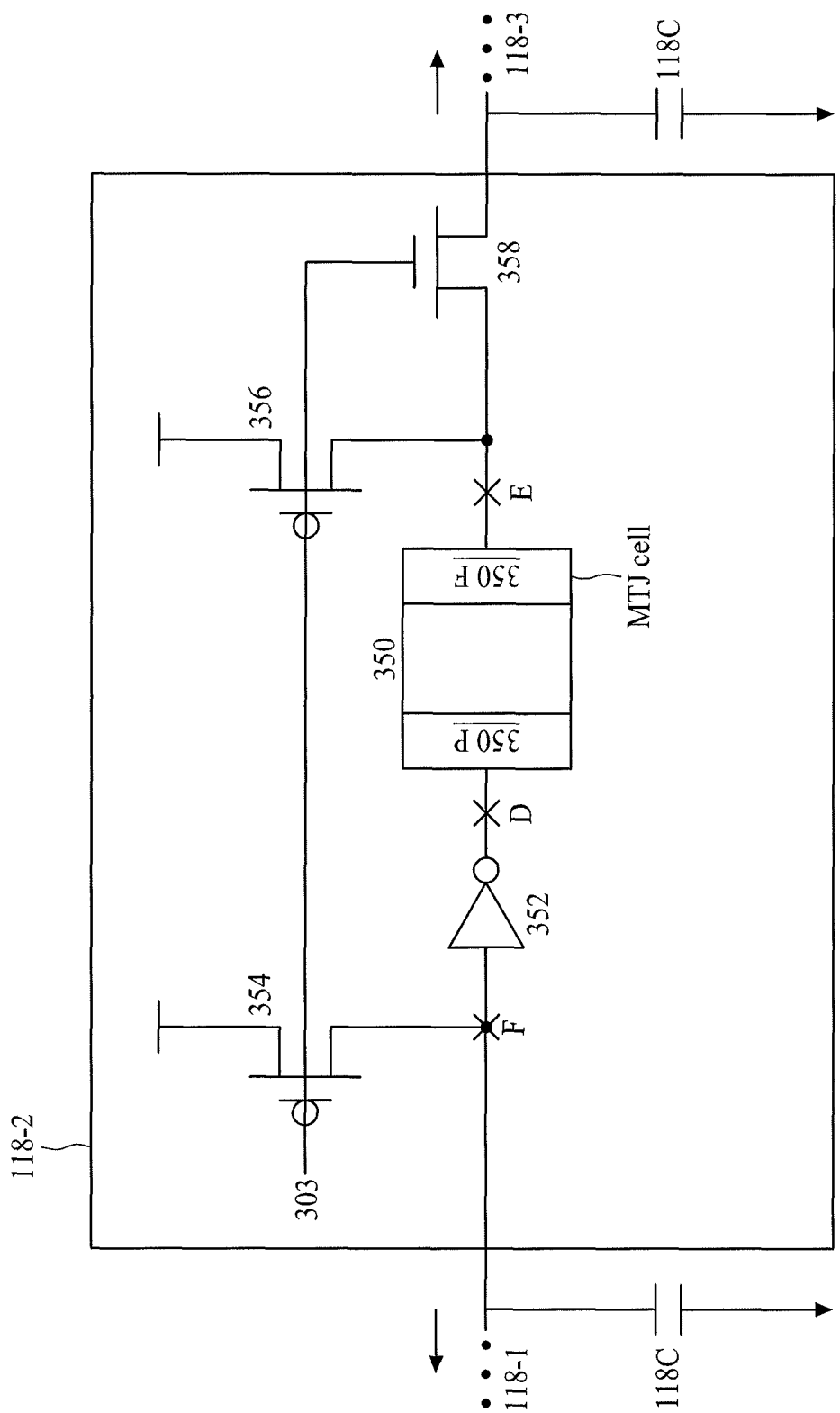
FIG. 3C illustrates an exemplary circuit diagram of a single stage of a second ring oscillation circuit of the temperature-based oscillation circuit of FIG. 3A, in accordance with some embodiments.

Referring now to FIG. 3C, an exemplary circuit diagram of the stage 118-2 of the second ring oscillation circuit 118 is shown, in accordance with various embodiments. In some embodiments, the stages of the second ring oscillation circuit 118 are substantially similar to one another, so the following discussion will be focused on the stage 118-2. For ease of discussion, the stage 118-2 is herein referred to as a current stage of the second oscillation circuit 118, and the neighboring stages 118-1 and 118-3 are herein referred to as a previous stage and a next stage of the second oscillation circuit 118, respectively. Although not shown in FIG. 3A, it is noted that between any neighboring stages of the second ring oscillation circuit 118, at least one capacitor is coupled therebetween, for example, 118C shown in FIG. 3C.

As mentioned above, each stage of the second ring oscillation circuit 118 includes at least one MTJ cell. Accordingly, the stage 118-2 includes a respective MTJ cell 350, and plural circuit components: an inverter 352, a first switch 354, a second switch 356, and a third switch 358. It is noted that, in accordance with some embodiments, the respective MTJ cell of each stage of the second ring oscillation circuit 118 is different from the respective MTJ cell of each stage of the first ring oscillation circuit 116. That is, the first ring oscillation circuit 116 includes a respective plurality of MTJ cells of the array 102, and the second ring oscillation circuit 118 includes another respective plurality of MTJ cells of the array 102. In some embodiments, the first and second switches (354 and 356) are each implemented by a p-type metal-oxide-semiconductor (PMOS) transistor, and the third switch 358 is implemented by an NMOS transistor. It is understood that each of the first, second, and third switches (354, 356, and 358) can be implemented by any of a variety of transistors or circuit components (e.g., a bipolar junction transistor (BJT), a transmission gate, etc.).

In some embodiments, the MTJ cell 350's respective pinned layer 350P and free layer 350F are coupled to an output terminal of the inverter 352 at node "D" and to a drain end of the PMOS transistor 356 at node "E," respectively. Further, the PMOS transistor 354's drain end is coupled to an input terminal of the inverter 352 at node "F," and the PMOS transistor 354's source end is coupled to a supply voltage (e.g., Vdd). The input terminal of the inverter 352 is coupled to the previous stage of the second ring oscillation circuit 118, e.g., 118-1. The PMOS transistor 354 is gated by the signal 303 shown in FIG. 3B (which will be discussed in further detail below). Similarly, the PMOS transistor 356 is also gated by the signal 303 and coupled to the supply voltage at the PMOS transistor 356's source end. The NMOS transistor 358 is also gated by the signal 303. Further, a drain end of the NMOS transistor 358 is coupled to the MTJ cell 350's fixed layer 350F at the node E, and a source end of the NMOS transistor 358 is coupled to the next stage of the second ring oscillation circuit 118, e.g., 118-3.

In order to cause the first ring oscillation circuit 116 to generate the above-mentioned temperature-dependent oscillation frequency and the second ring oscillation circuit 118 to generate the temperature-independent oscillation frequency, in some embodiments, the oscillation control circuit 122 asserts the signal 303 (FIGS. 3B and 3C) to a low logical state (hereinafter "LOW"). Accordingly, the logically inverted signal 301 is at a high logical state (hereinafter "HIGH"). Typically, the signal 303 is referred to as an enable signal of the temperature-based oscillation circuit 114.

Referring again to FIG. 3B, when the signal 301 is at HIGH, the NMOS transistors 304 and 306 are turned on. As such, voltage levels at nodes C and B are pulled to ground, i.e., LOW. Through the first inverter 302, a voltage level at node A is pulled to HIGH, which in turn causes a positive voltage (e.g., Vdd) to be applied across the MTJ cell 300 at the end of the pinned layer 300P. As described above in FIG. 2A, the MTJ cell 300 is then written into the AP state. Further, since the signal 303 is at LOW, the NMOS transistor 308 is turned off. Such a turned-off NMOS transistor 308 coupled between neighboring stages (e.g., 116-2 and 116-3) assures the stages of the first ring oscillation circuit 116 are electrically disconnected from one another when the enable signal (i.e., the signal 303) is at LOW.

Similarly, in FIG. 3C, when the signal 303 is at LOW, the PMOS transistors 354 and 356 are turned on such that the supply voltage (Vdd) can be coupled to the nodes F and E through the PMOS transistors 354 and 356, respectively. That is, the nodes E and F are at HIGH. Through the inverter 352, the node D is pulled to LOW while the node E remains at HIGH. As such, a positive voltage (e.g., Vdd) is applied across the MTJ cell 350 at the end of the free layer 350P, which causes the MTJ cell 350 to be written to the P state, according to the operation of the MTJ cell discussed with respect to FIG. 2A. Since the NMOS transistor 358 is gated by the signal 303, the NMOS transistor 358 is turned off. Similar to the above discussion of the first ring oscillation circuit 116, such a turned-off NMOS transistor 358 then causes the stages of the second ring oscillation circuit 118 to be electrically disconnected from one another.

Subsequently, when the enable signal 303 is asserted to HIGH, the temperature-based oscillation circuit 114 is activated. More specifically, when the enable signal 303 is asserted to HIGH (the signal 301 is at LOW), in FIG. 3B, the nodes B and C are floating, and the NMOS transistor 308 is turned on. Accordingly, the stages of the first ring oscillation circuit 116 are electrically connected to one another. As such, an oscillation signal 117 (FIG. 3A) with a corresponding oscillation frequency (hereinafter "first oscillation frequency") is generated by the first ring oscillation circuit 116. Moreover, when the NMOS transistor 308 is turned on, a current level of a current signal flowing through the MTJ cell 300 from the end of the free layer 300F may be limited. Accordingly, an issue of "read disturbance" that typically occurs in conventional MRAM array may be avoided. In general, a read disturbance is referred to that an MTJ cell's previously written state flips (e.g., from an AP state to a P state) when an unlimited current/voltage signal is applied on the MTJ cell.

In some embodiments, the first oscillation frequency is generated based on an inverse value of a sum of respective delays of the stages of the first ring oscillation circuit 116. More specifically, the first oscillation frequency is inversely proportional to the sum of the respective delays of the stages, i.e., oscillaiton frequency $\propto 1/\Sigma$(delay of each stage). In some embodiments, the delay of each stage includes a resistance-capacitance (RC) delay, wherein the resistance of the RC delay is provided by the resistance value of the respective MTJ cell (e.g., 300) and the capacitance of the RC delay is provided by the capacitor (e.g., 116C) coupled between neighboring stages. As such, the first oscillation frequency is inversely proportional to a sum of the RC delay at each stage, i.e., oscillaiton frequency $\propto 1/\Sigma$(RC delay of each stage). Moreover, since the MTJ cell at each stage of the first ring oscillation circuit 116 is written to the AP state, the resistance value provided by each MTJ cell is temperature-dependent, according to the discussion with respect to FIG. 2A. Accordingly, the RC delay of each stage is temperature-dependent, which in turn causes the first oscillation frequency of the oscillation signal 117 to be temperature-dependent.

Similarly, when the enable signal 303 is asserted to HIGH, in FIG. 3C, the NMOS transistor 358 is turned on. Accordingly, the stages of the second ring oscillation circuit 118 are electrically connected to one another. As such, an oscillation signal 119 (FIG. 3A) with a corresponding oscillation frequency (hereinafter "second oscillation frequency") is generated by the second ring oscillation circuit 118. In some embodiments, the second oscillation frequency is generated based on an inverse value of twice a sum of respective delays of the stages of the second ring oscillation circuit 118. Similar to the delay of the stage of the first ring oscillation circuit 116, the delay of each stage of the second ring oscillation circuit 118 includes an RC delay provided by the respective MTJ cell (e.g., 350) and the capacitor (e.g., 118C) coupled between neighboring stages. Since the MTJ cell at each stage of the second ring oscillation circuit 118 is in the P state, the resistance value of each MTJ cell is temperature-independent, according to the discussion with respect to FIG. 2A. The RC delay of each stage is then temperature-independent, which in turn causes the second oscillation frequency of the oscillation signal 119 to be temperature-independent. In some embodiments, the first and second oscillation frequencies are then provided to the digital counter 120 for quantitating the first oscillation frequency (temperature-dependent) so as to estimate a temperature reading, which will be discussed in further detail below.

Figure 3D:
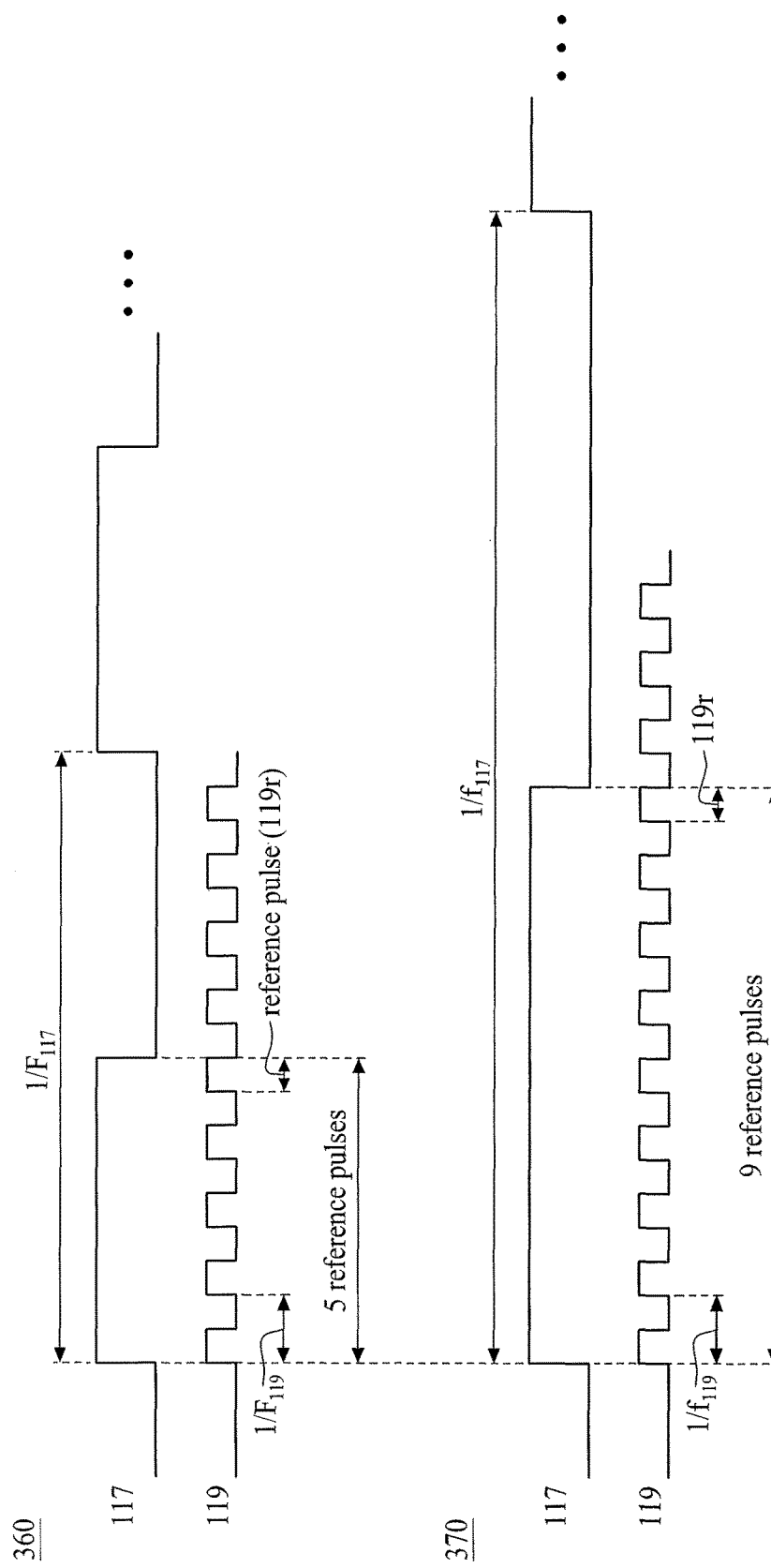
FIG. 3D illustrates exemplary waveforms to operate the temperature-based oscillation circuit of FIG. 3A, in accordance with some embodiments.

FIG. 3D illustrates two exemplary sets (360 and 370) of waveforms of the oscillation signals (117 and 119), in accordance with some embodiments. The oscillation signals (117 and 119) of the set 360 are provided by the first and second ring oscillation circuits (116 and 118), respectively, when the temperature-sensing device 100 is placed under a higher (on-chip) temperature ($T_1$); and the oscillation signals (117 and 119) of the set 370 are provided by the first and second ring oscillation circuits (116 and 118), respectively, when the temperature-sensing device 100 is placed under a lower (on-chip) temperature ($T_2$). Although the oscillation signals (117 and 119) in the sets of 360 and 370, respectively, are aligned with respect to each other (i.e., rising edges of the signals 117 and 119 are aligned with respect to each other), it is noted that, in some embodiments, the signals 117 and 119 may deviate from each other (e.g., a phase shift between the rising edges of the signals 117 and 119 is present).

As shown, the oscillation signal 117 of the set 360 is associated with a time period ($1/F_{117}$); the oscillation signal 119 of the set 360 is associated with a time period ($1/F_{119}$); the oscillation signal 117 of the set 370 is associated with a time period ($1/f_{117}$); oscillation signal 119 of the set 370 is associated with a time period ($1/f_{119}$). More specifically, $F_{117}$ represents an oscillaiton frequency of the oscillation signal 117 when the temperature-sensing device 100 is placed under $T_1$; $F_{119}$ represents an oscillation frequency of the oscillation signal 119 when temperature-sensing device 100 is placed under $T_1$; $f_{117}$ represents an oscillation frequency of the oscillation signal 117 when the temperature-sensing device 100 is placed under $T_2$; $f_{119}$ represents an oscillation frequency of the oscillation signal 119 when the temperature-sensing device 100 is placed under $T_2$.

As described above, the oscillation frequencies provided by the first and the second ring oscillation circuits (116 and 118) are determined based on respective RC delays, and such RC delays are determined according to the resistance value of the respective MTJ cells. Further, since the MTJ cell at each stage of the first oscillation circuit 116 is written to the AP state, the resistance value of the MTJ cells of the first oscillation circuit 116 is temperature-dependent; and since the MTJ cell at each stage of the second oscillation circuit 118 is written to the P state, the resistance value of the MTJ cells of the second oscillation circuit 118 is temperature-independent. Accordingly, in the illustrated embodiment of FIG. 3D, $F_{117}$ and $f_{117}$ generated at two different temperatures ($T_1$ and $T_2$) present different and respective values, while $F_{119}$ and $f_{119}$ present substantially identical values. It is also noted that since the MTJ cells of the second oscillation circuit 118 are each written to the P state, the MTJ cell of the second oscillation circuit 118 has a lower resistance value when compared to the resistance value of the MTJ cell of the first oscillation circuit 116. As such, $F_{119}$ and $f_{119}$ are substantially higher than $F_{117}$ and $f_{117}$ (since, as described above, the oscillation frequency is inversely proportional to the resistance value of the MTJ cell). Still further, since $T_1$ is higher than $T_2$, the resistance value of the MTJ cell of the first oscillation circuit 116 under $T_1$ is lower than that under $T_2$, which causes $F_{117}$ to be higher than $f_{117}$. In turn, $1/F_{117}$ is shorter than $1/f_{117}$.

In some embodiments, the oscillation control circuit 122 uses the digital counter 120 (FIG. 3A) to count a number of reference pulses (119r) of the temperature-independent oscillation signal 119 so as to quantitate the temperature-dependent oscillation signal 117. More specifically, each reference pulse 119r has a substantially constant pulse width under varying temperatures such that, in some embodiments, the digital counter 120 is configured to use the constant pulse width of the reference pulse 119r to count how many reference pulses 119r can match a pulse width of the temperature-dependent oscillation signal 117 (i.e., quantitating the temperature-dependent oscillation signal 117). Either a high pulse width or a low pulse width of the temperature-dependent oscillation signal 117 can be quantitated.

For example, as shown in FIG. 3D, under the higher $T_1$ (the set 360), the digital counter 120 counts one pulse width of the oscillation signal 117 corresponding to about five pulse widths of the reference pulse 119r; and under the lower $T_2$ (the set 370), the digital counter 120 counts one high pulse of the oscillation signal 117 corresponding to about nine pulse widths of the reference pulse 119r. In some embodiments, the digital counter 120 may provide the counted number of reference pulse widths (e.g., the pulse width of 119r) to the oscillation control circuit 122, and the oscillation control circuit 122 maps the counted number to a particular temperature value by using a pre-calibrated oscillation frequency-to-temperature (OFT) lookup table. The oscillation control circuit 122 then outputs the mapped temperature value as an estimation of a temperature reading. Further to such embodiments, the OFT lookup table may include a plurality of calibration sets, wherein each calibration set has a correspondence of counted numbers of reference pulse widths to a pre-measured temperature. The OFT lookup table may be stored in a computer-readable medium storage of the oscillation control circuit 122. As such, the temperature-based oscillation circuit 114 can be used to estimate respective temperature readings when the temperature-sensing device 100 is placed at a temperature-varying environment or coupled to a circuit/component with varying temperatures, in accordance with some embodiments of the present disclosure.

Figure 3E:
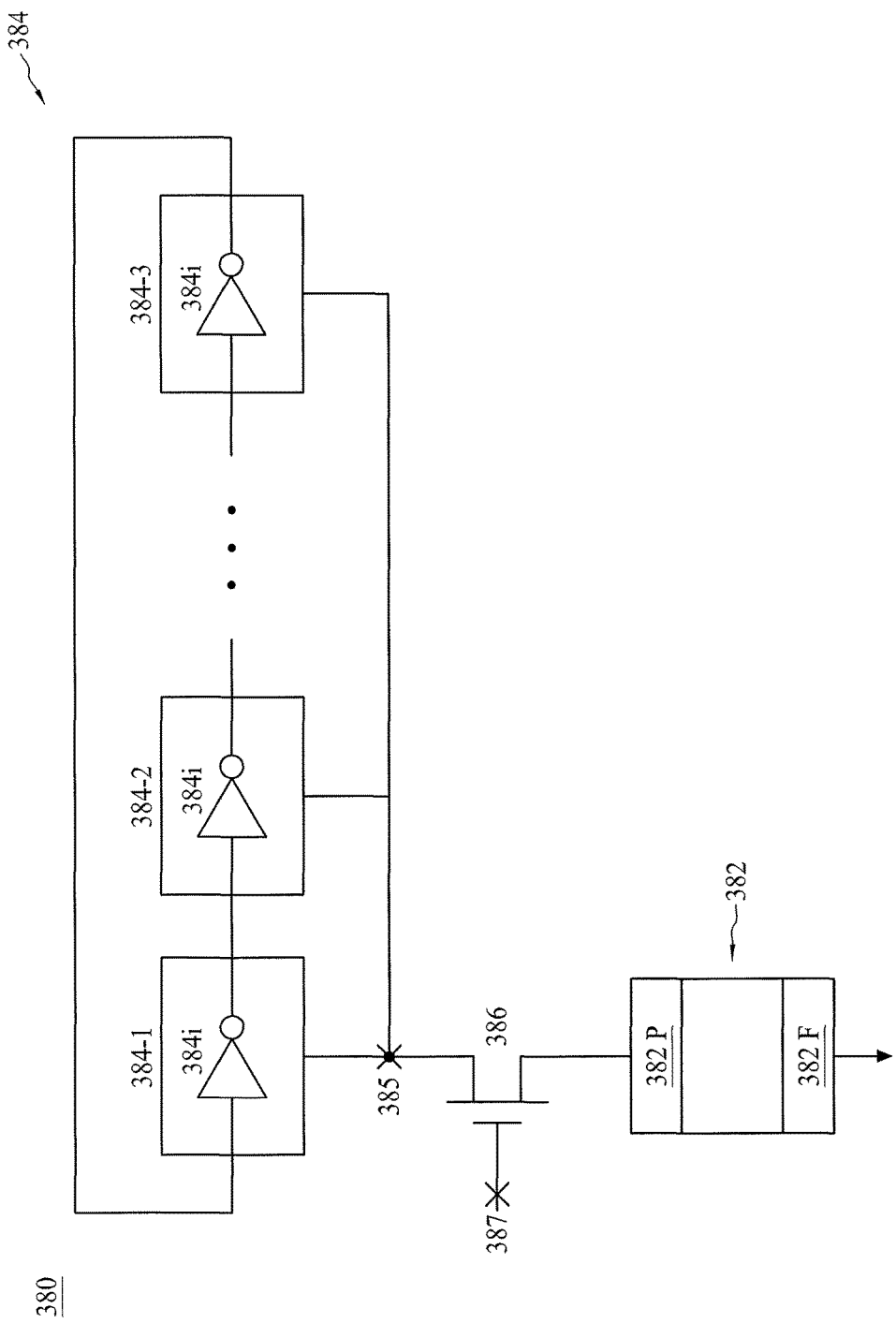
FIG. 3E illustrates an exemplary schematic diagram of another embodiment of the temperature-based oscillation circuit of the temperature-sensing device of FIG. 1, in accordance with some embodiments.

FIG. 3E illustrates a schematic diagram of another embodiment of the first ring oscillation circuit 116 of the temperature-based oscillation circuit 114. For clarity, the embodiment of the first ring oscillation circuit 116 in FIG. 3E is herein referred to as ring oscillation circuit 380. The ring oscillation circuit 380 is substantially similar to the first ring oscillation circuit 116 except that the ring oscillation circuit 380 uses a global MTJ cell 382 to drive a ring circuit 384.

Similar to the ring oscillation circuits 116 and 118 (FIG. 2A), the ring circuit 384 also includes an odd number of stages (384-1, 384-2, 384-3, etc.) that are serially coupled to one another and formed as a ring. Each stage of the ring circuit 384 includes at least one inverter 384i, and all the inverters 384i are coupled to a common node 385. Further, the common node 385 is coupled to a drain end of a transistor 386. The transistor 386 may be implemented by an NMOS transistor although any other type of transistors may be used. The transistor 386 is gated by a signal 387. In some embodiments, the signal 387 is a voltage signal that is clamped (fixed) at one or more voltage levels so as to provide the global MTJ cell 382 a fixed supply voltage. Thus, the signal 387 is typically referred to as a clamp signal. A source end of the transistor 386 is coupled to the global MTJ cell 382.

In some embodiments, operations of the ring oscillation circuits 116, 118, and 380 are substantially similar to each other. Accordingly, the operation of the ring oscillation circuit 380 is briefly described as follows. To operate the ring oscillation circuit 380, the global MTJ cell 382 is written to the AP state. In some embodiments, writing the global MTJ cell 382 to the AP state may be performed by a write circuit (not shown). After the global MTJ cell 382 is at the AP state, the global MTJ cell 382 may function as a resistor that has a temperature-dependent resistance value. Simultaneously or subsequently, the clamp signal 387 with a substantially fixed voltage level (e.g., a positive voltage signal that is greater than the threshold voltage of the transistor 386) is provided to the gate end of the transistor 386. Since the transistor 386 is gated by the substantially fixed voltage signal 387 (and the global MTJ cell 382 functions as a resistor), a voltage level at the node 385 is determined by the resistance value of the global MTJ cell 382, which is temperature-dependent. In some embodiments, such a temperature-dependent voltage level at the node 385 can be used to control an oscillation frequency of the ring circuit 384. For example, the oscillation frequency of the ring circuit 384 may be inversely proportional to the resistance value of the global MTJ cell 382. That is, when the ring oscillation circuit 380 is placed under a higher temperature, the ring circuit 384 may provide a lower oscillation frequency; and when the ring oscillation circuit 380 is placed under a lower temperature, the ring circuit 384 may provide a higher oscillation frequency. Such temperature-dependent oscillation frequencies may be used to estimate a temperature reading by using the temperature-independent reference pulse, as described above.

In some embodiments, the temperature-based oscillation circuit 114 may optionally include a divider (not shown) coupled between the digital counter 120 and either the first ring oscillation circuit 116 or the second ring oscillation circuit 118. The divider is configured to multiply the first oscillation frequency (e.g., $F_{117}$, $f_{117}$, etc.) by an integer number "N," or divide the second oscillation frequency (e.g., $F_{119}$, $f_{119}$, etc.) by the integer number N. In some embodiments, such an integer number N may be equal to the number of the stages in the ring oscillation circuits 116, 118, and 280.

Figure 3F:
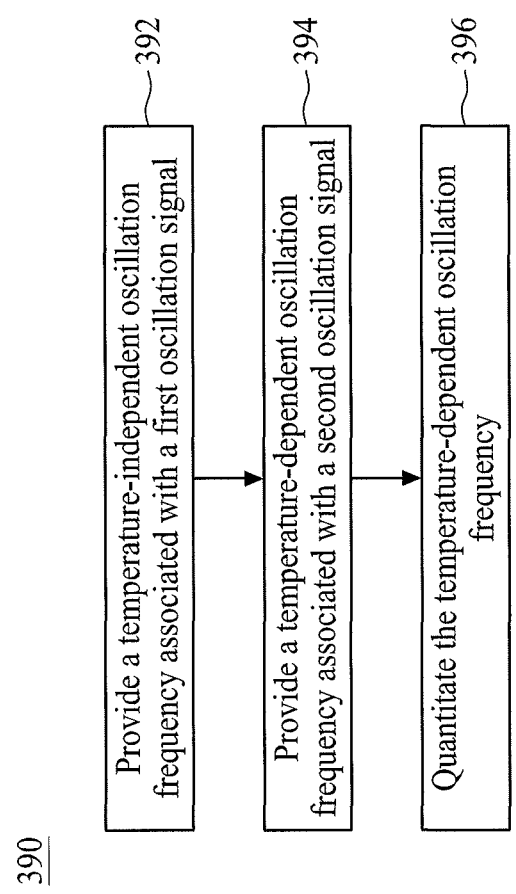
FIG. 3F illustrates a flow chart of an exemplary method to operate the temperature-based oscillation circuit of FIG. 3A, in accordance with some embodiments.

FIG. 3F illustrates a flow chart of an exemplary method 390 to operate the temperature-based oscillation circuit 114 of the memory circuit 100 (FIG. 2A), in accordance with various embodiments. Operations of the method 390 are performed by the respective components illustrated in FIGS. 3A-3D. For purposes of discussion, the following embodiment of the method 390 will be described in conjunction with FIGS. 3A-3D. The illustrated embodiment of the method 390 is merely an example. Therefore, it should be understood that any of a variety of operations may be omitted, re-sequenced, and/or added while remaining within the scope of the present disclosure.

The method 390 starts at operation 392 in which a temperature-independent oscillation frequency is provided, in accordance with various embodiments. As described above, such a temperature-independent oscillation frequency is associated with a first oscillation signal (e.g., 119) that may be provided by a first ring oscillation circuit having each of its respective MTJ cells being written to the P state, for example, the ring oscillation circuit 118.

The method 390 continues to operation 394 in which a temperature-independent oscillation frequency is provided, in accordance with various embodiments. Such a temperature-dependent oscillation frequency is associated with a second oscillation signal (e.g., 117) that may be provided by a second ring oscillation circuit having each of its respective MTJ cells being written to the AP state, for example, the ring oscillation circuit 116.

The method 390 continues to operation 396 in which a digital counter (e.g., 120) uses a reference pulse (e.g., 119r) of the first oscillation signal 119 (that is temperature-independent) to quantitate the second oscillation signal 117's temperature-dependent oscillation frequency, in accordance with various embodiments. More specifically, the digital counter 120 uses a reference pulse width of the reference pulse 119r to count the number of the reference pulse width that can match a pulse width of the temperature-dependent oscillation signal 117 so as to read out a respective temperature value.

FIG. 4A illustrate a circuit diagram of a part of the thermal alarm circuit 124, and FIG. 4B illustrates a block diagram of another part of the thermal alarm circuit 124, in accordance with some embodiments. The thermal alarm circuit 124 includes an input/output (I/O) circuit 402, a word line (WL) driver 404, and an alarm control circuit 406. The I/O circuit 402 includes a plurality of sensing amplifiers (402-1, 402-2, etc.) that are each coupled to a plurality of MTJ cells along a particular column and a reference MTJ cell (e.g., 102-R), which will be discussed in further detail below.

In some embodiments, the thermal alarm circuit 124 is configured to monitor an on-chip temperature of a system circuit into which the temperature-sensing device 100 is integrated and/or other circuit components of the system circuit based on a detected amount of read failures of the MTJ array 102 (FIG. 1). More specifically, the thermal alarm circuit 124 may activate an alarm signal indicating a presence of an above-threshold on-chip temperature when a first amount of MTJ cells (e.g., 102-1~102-12) failed to be read exceeds a first pre-defined threshold.

For ease of discussion, an embodiment of the MTJ array 102 is reproduced in FIG. 4A. As mentioned above, the MTJ cells of the MTJ array 102 are coupled to one another through respective bit lines (BL's), word lines (WL's), and source lines (SL's). In FIG. 4A, the MTJ cells (102-1, 102-3, 102-4, 102-6, 102-10, and 102-12) are shown. More specifically, each MTJ cell is arranged in respective column and row, and coupled to other MTJ cells along the respective column by respective BL and SL and other MTJ cells along the respective row by respective WL.

For example, the MTJ cell 102-1 is arranged in column "A" and row "c," and coupled to the MTJ cells (102-4 and 102-10) that are also arranged in column A through BL 104 and SL 106 and the MTJ cell 102-3 that is also arranged in row c through WL 103; the MTJ cell 102-4 is arranged in column A and row "d," and coupled to the MTJ cells (102-1 and 102-10) that are also arranged in column A through BL 104 and SL 106 and the MTJ cell 102-6 that is also arranged in row d through WL 105; the MTJ cell 102-10 is arranged in column A and row "e," and coupled to the MTJ cells (102-1 and 102-4) that are also arranged in column A through BL 104 and SL 106 and the MTJ cell 102-12 that is also arranged in row e through WL 107; the MTJ cell 102-3 is arranged in column "B" and row c, and coupled to the MTJ cells (102-6 and 102-12) that are also arranged in column B through BL 108 and SL 110 and the MTJ cell 102-1 that is also arranged in row c through WL 103; the MTJ cell 102-6 is arranged in column B and row d, and coupled to the MTJ cells (102-3 and 102-12) that are also arranged in column B through BL 108 and SL 110 and the MTJ cell 102-4 that is also arranged in row d through WL 105; the MTJ cell 102-12 is arranged in column B and row e, and coupled to the MTJ cells (102-3 and 102-6) that are also arranged in column B through BL 108 and SL 110 and the MTJ cell 102-10 that is also arranged in row e through WL 107.

In some embodiments, each MTJ cell is coupled to its respective SL via an access transistor, and the access transistor is coupled to the MTJ cell's respective WL at the access transistor's gate end. For example, the MTJ cell 102-1 is coupled to the SL 106 via access transistor 102-1T, and the access transistor 102-1T's gate end is coupled to the WL 103; the MTJ cell 102-3 is coupled to the SL 110 via access transistor 102-3T, and the access transistor 102-3T's gate end is coupled to the WL 103; the MTJ cell 102-4 is coupled to the SL 106 via access transistor 102-4T, and the access transistor 102-4T's gate end is coupled to the WL 105; the MTJ cell 102-6 is coupled to the SL 110 via access transistor 102-6T, and the access transistor 102-6T's gate end is coupled to the WL 105; the MTJ cell 102-10 is coupled to the SL 106 via access transistor 102-10T, and the access transistor 102-10T's gate end is coupled to the WL 107. The access transistor of each MTJ cell is configured to be turned on by a WL assertion signal provided through the MTJ cell's respective WL, which will be discussed in further detail below.

As mentioned above, in some embodiments, each sensing amplifier of the I/O circuit 402 is coupled to plural MTJ cells along a respective column and the reference MTJ cell 102-R. More specifically, each sensing amplifier may be coupled to the plural MTJ cells through the column's BL. For example, the sensing amplifier 402-1 is coupled to the MTJ cells (102-1, 102-4, and 102-10) through the BL 104 of column A and the reference MTJ cell 102-R; the sensing amplifier 402-2 is coupled to the MTJ cells (102-3, 102-6, and 102-12) through the BL 108 of column B and the reference MTJ cell 102-R. In some embodiments, such a reference MTJ cell 102-R may be arranged in a dummy column or a dummy row of the MTJ array 102. Accordingly, the dummy column or row may include respective BL/SL (hereinafter "reference BL/SL") for the reference MTJ cell 102-R to be coupled to the sensing amplifiers (402-1, 402-2, etc.).

Referring now to FIG. 4B, the WL driver 404 is coupled to the MTJ array 102 through the WL's (103, 105, 107, etc.). The alarm control circuit 406 is coupled to the WL driver 404 and the I/O circuit 402. In some embodiments, when the alarm control circuit 406 selects an MTJ cell to be read, the alarm control circuit 406 is configured to cause the WL driver 404 to provide a WL assertion signal to be transmitted on the selected MTJ cell's coupled WL. Alternatively stated, when the alarm control circuit 406 wants to read a state (e.g., the P state or the AP state) of an MTJ cell, the alarm control circuit 406 is configured to cause the WL driver 404 to assert the MTJ cell's respective WL so as to turn on the MTJ cell's access transistor. Prior to, simultaneously with, or subsequently to the access transistor being turned on, the MTJ's BL and SL are pulled to different voltage levels that correspond to HIGH and LOW, respectively. Accordingly, the MTJ's respective sensing amplifier can read the state of the MTJ cell by detecting a voltage difference present on the respective BL and the reference BL/SL (coupled to the reference MTJ cell 102-R). Consequently, the alarm control circuit 406 may receive the read state of the MTJ cell from the sensing amplifier.

In a non-limiting example, a state of the MTJ cell 102-1 may be read by at least the following operations: WL 103 is asserted by the alarm control circuit 406; the access transistor 102-1T is turned on; the BL 104 is pulled to HIGH and the SL 106 is pulled to LOW; a voltage difference between the reference BL (coupled to the reference MTJ cell 102-R) and the BL 104 is sensed by the sensing amplifier 402-1; depending on the amount of the voltage difference, the state is differentiated (read) by the sensing amplifier 402-1; and the read state is received by the alarm control circuit 406.

To recap, when an MTJ cell is written into the P state, the MTJ cell presents a first resistance value that is temperature-independent; and when the MTJ cell is in the AP state, the MTJ cell presents a second resistance value that is temperature-dependent. Further, the first resistance value is generally smaller than the plural second resistance values, as described with respect to FIG. 3A. As further described with respect to FIG. 3B, an MTJ cell's resistance value is inversely proportional to its respective cross-sectional area. In accordance with some embodiments of the present disclosure, the reference MTJ cell 102-R (formed in the dummy column/row of the MTJ array 102) is written into the P state, and each of the other MTJ cells (not formed in the dummy column/row of the MTJ array 102) is written into the AP state. Moreover, a cross-sectional area of the reference MTJ cell 102-R is formed substantially smaller than a common cross-sectional area of the other MTJ cells, e.g., 102-1~102-12. As such, the resistance value of the reference MTJ cell 102-R (hereinafter "$R_{ref}$") may be substantially similar to the resistance value of the other MTJ cells (hereinafter "$R_{MTJ}$") under a high temperature threshold. In some embodiments, such a high temperature threshold may be a temperature pre-defined by the alarm control circuit 406. When the alarm control circuit 406 detects an on-chip temperature has reached or exceeded the high temperature threshold, the alarm control circuit 406 may activate an alarm signal. Further, in some embodiments, the alarm control circuit 406 activates the alarm signal based on detecting a certain amount of read failures of the MTJ cells in the MTJ array 102, which will be discussed in further detail as follows.

Since the reference MTJ cell 102-R is in the P state, $R_{ref}$ is temperature-independent; and since each of the MTJ cells is in the AP state, $R_{MTJ}$ is temperature-dependent. When an on-chip temperature (monitored by the thermal alarm circuit 124) reaches the above-mentioned high temperature threshold, the $R_{MTJ}$ may vary to be substantially similar to $R_{ref}$. Also, as mentioned above, each sensing amplifier of the I/O circuit 402 is configured to read a state of an MTJ cell based on a voltage difference between the reference BL/SL and the MTJ cell's respective BL. In some embodiments, such a voltage difference is present because of the difference between $R_{MTJ}$ and $R_{ref}$. Thus, when $R_{ref}$ is substantially similar to $R_{MTJ}$ (e.g., the on-chip temperature≥the high temperature threshold), the sensing amplifier is unable to sense the voltage difference and thus fails to difference the state of the MTJ cell, which is referred to as a "read failure" of the MTJ cell. In some embodiments, when the alarm control circuit 406 detects that the amount of read failures (i.e., MTJ cells failed to be read) has reached or exceeded a pre-defined threshold, the alarm control circuit 406 may determine that the on-chip temperature has accordingly reached or exceeded the high temperature threshold.

Alternatively or additionally, the alarm control circuit 124 may use any of a variety of the MTJ cell's stability characteristics (e.g., a write failure, a retention failure, etc.) to monitor an on-chip temperature. In an example, when the on-chip temperature drops, a current level (a write current level) that allows a write operation to be performed on an MTJ cell accordingly increases. In some embodiments, a write operation performed on an MTJ cell generally includes writing the MTJ cell to either the P state or the AP state, as described with respect to FIG. 3A. As the on-chip temperature keeps dropping, the MTJ cell may be subjected to be written successfully, i.e., a write failure, without increasing the write current level. Thus, in some embodiments, the alarm control circuit 124 may use a constant current source to write the MTJ cells of the MTJ array 102, and such a constant current source is pre-calibrated to correspond to a low temperature threshold. Once the on-chip temperature drops below the low temperature threshold, one or more MTJ cells may have write failure. The alarm control circuit 124 can launch an alarm signal when a detected amount of write failures in the MTJ array 102 has reached or exceeded a pre-defined threshold.

In another example, the alarm control circuit 124 may use the MTJ cell's thermal stability factor (Δ) to detect whether the on-chip temperature exceeds a high temperature threshold. In some embodiments, the value of the thermal stability factor (Δ) is inversely proportional to an environmental temperature of the MTJ cell. In general, when an MTJ cell has a lower value of A, the MTJ cell may represent a relatively unstable characteristic. More specifically, when the MTJ cell's A drops below a stability threshold, for example, with an increasing temperature, the state originally written in the MTJ cell may flip relatively easily such as flipping from the AP state to the P state or vice versa. The flipping of the state in the MTJ cell is typically referred to as "retention failure" of the MTJ cell. Based on the such a temperature-dependent retention failure, in some embodiments, the alarm control circuit 124 may write the MTJ cells of the MTJ array 102 to the AP state (since, in general, flipping from the P state to the AP state takes a higher energy than flipping from the AP state to the P state). And when the MTJ cells have ever experienced a high temperature threshold, one or more MTJ cells may become unstable and flip, i.e., having retention failure. Thus, the alarm control circuit 124 can detect whether an amount of such retention failures in the MTJ array 102 is greater than a pre-defined threshold, and further determine whether the MTJ array 102 has experienced the high temperature threshold.

Figure 5A:
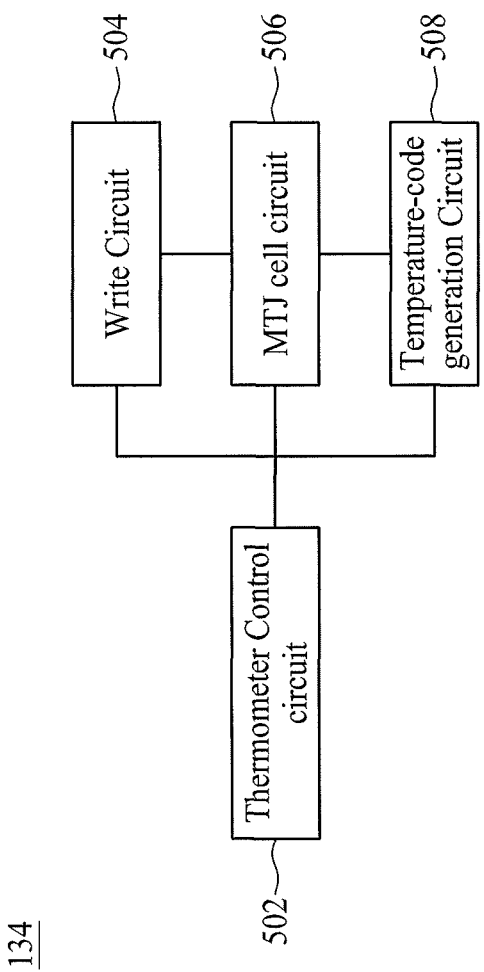
FIG. 5A illustrates an exemplary block diagram of a thermometer circuit of the temperature-sensing device of FIG. 1, in accordance with some embodiments.

FIG. 5A illustrates an exemplary block diagram of the thermometer circuit 134, in accordance with various embodiments. The thermometer circuit 134 includes a thermometer control circuit 502, a write circuit 504, an MTJ cell circuit 506, and a temperature-code generation circuit 508.

Although the illustrated embodiment of FIG. 1 shows that the thermometer circuit 134 is a separate block from the MTJ array 102, in some embodiments, the MTJ cell circuit 506 may include one or more of the MTJ cells (e.g., 102-1~102-12) of the MTJ array 102. Further to the illustrated embodiment of FIG. 5A, the thermometer control circuit 502 is coupled to each of the write circuit 504, the MTJ cell circuit 506, and the temperature-code generation circuit 508. The thermometer control circuit 502, the write circuit 504, the MTJ cell circuit 506, and the temperature-code generation circuit 508 will be discussed in further detail below with respect to FIG. 5B.

Figure 5B:
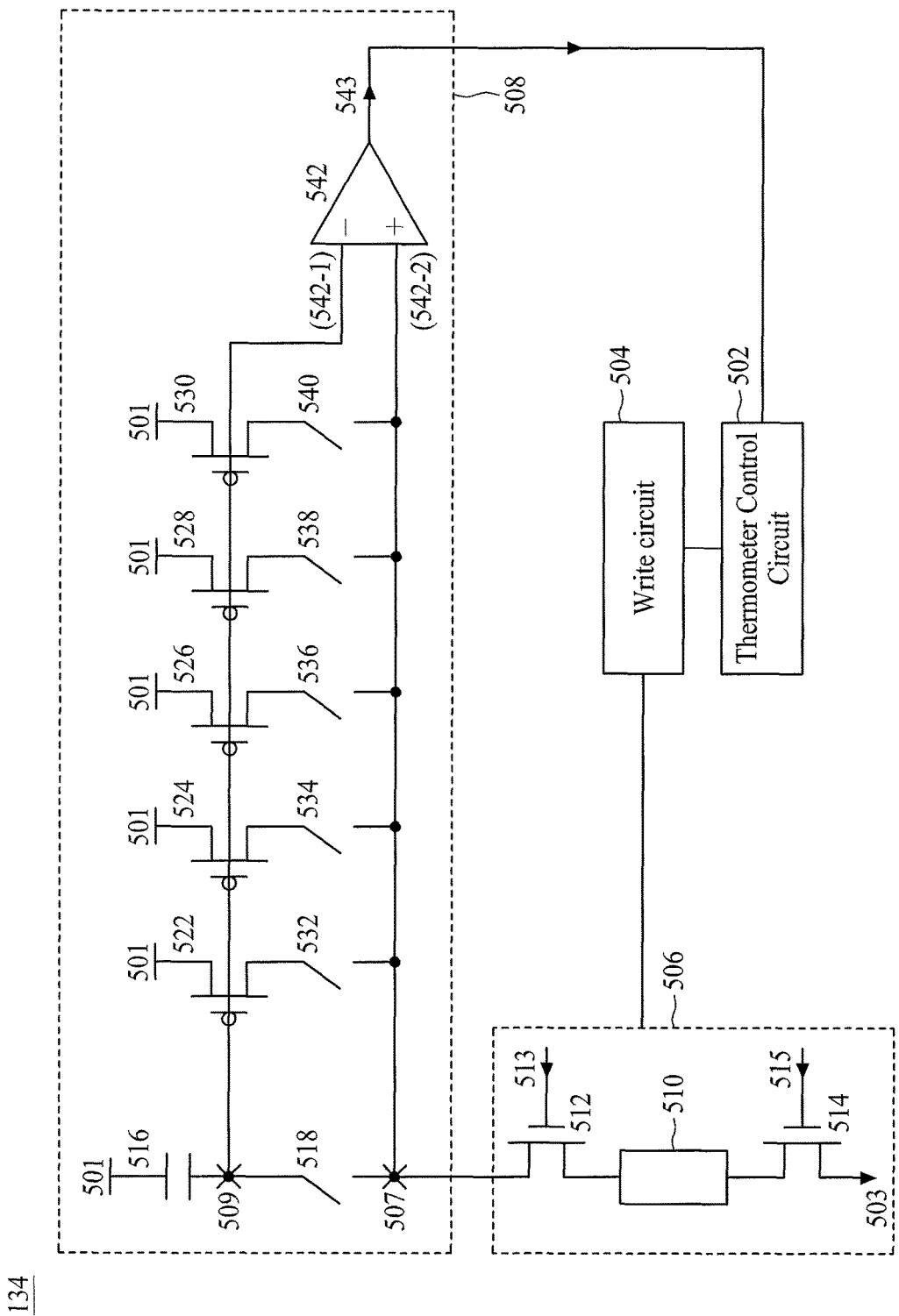
FIG. 5B illustrates a hybrid circuit and block diagram of an embodiment of the thermometer circuit of FIG. 5A, in accordance with some embodiments.

Referring now to FIG. 5B, a hybrid block and circuit diagram of an exemplary embodiment of the thermometer circuit 134 is illustrated. For brevity, the thermometer control circuit 502 and the write circuit 504 are shown as representative blocks, and only the MTJ cell circuit 506 and the temperature-code generation circuit 508 are shown as circuitries, respectively.

In some embodiments, the thermometer control circuit 502 includes a microcontroller, a computer-readable medium storage, a bus, etc., such that the thermometer control circuit 502 can control each of the components of the thermometer circuit 134, e.g., the write circuit 504, the MTJ cell circuit 506, the temperature-code generation circuit 508, etc. The write circuit 504, coupled to the thermometer control circuit 502, may include a driver circuit and one or more current/voltage sources that are each coupled to the MTJ cell circuit 506. As such, the write circuit 504 may write the MTJ cell (of the MTJ cell circuit 506) to a desired state (e.g., the AP state or the P state) based on instructions of the thermometer control circuit 502.

In some embodiments, the MTJ cell circuit 506 includes an MTJ cell 510, and first and second transistors (512 and 514). The first and second transistors (512 and 514) may be each implemented by an NMOS transistor although any other type of transistors may be used. More specifically, the first NMOS transistor 512 is coupled to the MTJ cell 510 at its respective source end, and coupled to the temperature-code generation circuit 508 at a common node 507; and the second NMOS transistor 514 is coupled to the MTJ cell 510 at its respective drain end, and coupled to supply voltage 503 (e.g., ground) at its respective source end. Further, the first NMOS transistor 512 is gated by a clamp signal 513; and the second NMOS transistor 514 is gated by an enable signal 515. In some embodiments, the clamp signal 513 is substantially similar to the clamp signal 287 (FIG. 2E) that is configured to provide a substantially fixed voltage level to the transistor 512. As such, the transistor 512 can convert a resistance value of the MTJ cell 510 into an MTJ-based current signal that is provided to the temperature-code generation circuit 508, which will be discussed in further detail below. In some embodiments, the enable signal 515 may be provided by the thermometer control circuit 502. The thermometer control circuit 502 may assert the enable signal to HIGH so as to turn on the second NMOS transistor 514, which in turn enables the MTJ-based current signal to be provided to the temperature-code generation circuit 508. On the other hand, the thermometer control circuit 502 may assert the enable signal to LOW so as to turn off the second NMOS transistor 514, which accordingly disenables the MTJ-based current signal to be provided to the temperature-code generation circuit 508.

In some embodiments, the temperature-code generation circuit 508 includes a capacitor 516, a main switch 518, a plurality of coding devices (522, 524, 526, 528, and 530), a plurality of coding switches (532, 534, 536, 538, and 540), and a comparator 542. Although each coding device in the illustrated embodiment of FIG. 5A is implemented by a PMOS transistor, it is understood that any type of transistors or gated conductors can be used to implement the coding device. Further, although only five coding devices are shown in FIG. 5A, it is also understood that any desired number of coding devices can be included in the temperature-code generation circuit 508. Similarly, although only five coding switches are shown, it is also understood that any desired number of coding switches can be included in the temperature-code generation circuit 508. In some embodiments, numbers of the coding devices and coding switches may be identical to each other.

Further to the embodiments of the temperature-code generation circuit 508, the capacitor 516 having two conductive plates: one is coupled to supply voltage 501 (e.g., Vdd); and the other is coupled to the main switch 518 at node 509. The main switch 518 is coupled between the nodes 507 and 509. Each of the plurality of PMOS transistors (522, 524, 526, 528, and 530) is coupled between the supply voltage 501 and a respective coding switch. Further, each PMOS transistor (522, 524, 526, 528, or 530) is coupled to the MTJ cell circuit 506 by the respective coding switch. For example, PMOS transistor 522 is coupled to the MTJ cell circuit 506 by the coding switch 532; the PMOS transistor 524 is coupled to the MTJ cell circuit 506 by the coding switch 534; the PMOS transistor 526 is coupled to the MTJ cell circuit 506 by the coding switch 536; the PMOS transistor 528 is coupled to the MTJ cell circuit 506 by the coding switch 538; the PMOS transistor 530 is coupled to the MTJ cell circuit 506 by the coding switch 540. Moreover, the plurality of PMOS transistors (522, 524, 526, 528, and 530) are coupled to the node 509 at respective gate ends, and are each gated by a voltage signal at the node 509. The comparator 542 has an inverting input terminal 542-1 that is coupled to the node 509, and a non-inverting input terminal 542-2 coupled to the node 507. When the main switch 518 is turned on (i.e., closed), the capacitor 516 is coupled to the MTJ cell circuit 506 (i.e., the nodes 507 and 509 are coupled to each other). Similarly, when each of the coding switches (532, 534, 536, 538, 540, etc.) is turned on, the respective PMOS transistor is coupled to the MTJ cell circuit 506.

According to some embodiments of the present disclosure, the thermometer circuit 134 is configured to use temperature-independent and temperature-dependent resistance values of the MTJ cell 510 to derive first and second temperature codes, respectively. Based on the operation of the MTJ cell as discussed with respect to FIG. 3A, the MTJ cell 510 may present a temperature-independent resistance value when the MTJ cell 510 is written to the P state; and the MTJ cell 510 may present a temperature-dependent resistance value when the MTJ cell 510 is written to the AP state. Moreover, the temperature-independent resistance value is generally larger than the temperature-dependent resistance value(s). Using the difference between the temperature-independent resistance value and temperature-dependent resistance value under a particular temperature, the first temperature code corresponding to temperature-independent resistance value and the second temperature code corresponding to temperature-dependent resistance value can be presented by a respective combination of toggled behaviors of the coding switch (532, 534, 536, 538, 540, etc.). Further, the second temperature code may be used to estimate a temperature reading corresponding to that particular temperature. Details of operations of the thermometer circuit 134 are discussed as follows.

To generate the first temperature code, the thermometer control circuit 502 causes the write circuit 504 to write the MTJ cell 510 into the P state. In some embodiments, the write circuit 504 may apply a sufficiently large current to flow through the MTJ cell 510 from the MTJ cell 510's free layer so as to write the MTJ cell 510 into the P state. Prior to, simultaneously with, or subsequently to the MTJ cell 510 being written to the P state, the enable signal 515 is pulled HIGH (by the thermometer control circuit 502) thereby turning on the NMOS transistor 514. The NMOS transistor 512 is biased at a substantially fixed voltage level provided by the clamp signal 513. Accordingly, the resistance value of the MTJ cell 510 can be converted to a first MTJ-based current signal (hereinafter "$I_1$"). The main switch 518 and the plurality of coding switches (532, 534, 536, 538, 540, etc.) are turned on (i.e., closed), which causes the first MTJ-based current signal $I_1$ to be distributed across the plurality of PMOS transistors (522, 524, 526, 528, 530, etc.) and charge the capacitor 516. In some embodiments, the plurality of PMOS transistors (522, 524, 526, 528, 530, etc.) are formed to have a substantially identical size (e.g., a ratio of channel width to channel length) so that the first MTJ-based current signal $I_1$ may be equally distributed across the plurality of PMOS transistors (522, 524, 526, 528, 530, etc.). In the illustrated embodiment of FIG. 5B, the PMOS transistors (522, 524, 526, 528, 530) share a substantially identical size so that a respective current level of a current signal flowing through each PMOS transistor may be equal to about ⅕ of the first MTJ-based current signal, i.e., $\frac{1}{5} \times I_1$.

In some embodiments, after the first MTJ-based current signal $I_1$ finishes charging the capacitor 516 (e.g., in a steady-state), the first MTJ-based current signal $I_1$ may be effectively stored in the capacitor 516, which also causes the voltage level at the node 509 to be at a substantially stable value. Such a substantially stable voltage level at the node 509 is later used as a reference voltage, and therefore referred to as "$V_{Rp}$" hereinafter. It is noted that the node 509 is connected to the gate ends of the PMOS transistors (522, 524, 526, 528, and 530), the inverting input terminal 542-1 of the comparator 542, and the node 207 when the main switch 5178 is turned on. In some embodiments, the comparator 542 is not enabled when the main switch 518 is turned on so that an output signal 543 of the comparator 542 may be at LOW. According to some embodiments of the present disclosure, the thermometer control circuit 502 may store the respective toggled behaviors of the coding switches (532, 534, 536, 538, and 540) as the first temperature code. For example, when the first MTJ-based current signal $I_1$ is provided to the temperature-code generation circuit 508, all the coding switches (532, 534, 536, 538, and 540) are turned on. As such, the thermometer control circuit 502 may store the first temperature as five bits: 11111, wherein the leftmost bit corresponds to the toggled behavior of the coding switch 532; the second left bit corresponds to the toggled behavior of the coding switch 534; the middle bit corresponds to the toggled behavior of the coding switch 536; the second right bit corresponds to the toggled behavior of the coding switch 538; and the rightmost bit corresponds to the toggled behavior of the coding switch 540. And, in some embodiments, "1" represents that the respective coding switch is turned on, and "0" represents that the respective coding switch is turned off.

To generate the second temperature code, in some embodiments, the main switch 518 is turned off (i.e., open). The thermometer control circuit 502 causes the write circuit 504 to write the MTJ cell 510 into the AP state. In some embodiments, the write circuit 504 may apply a sufficiently large current to flow through the MTJ cell 510 from the MTJ cell 510's pinned layer so as to write the MTJ cell 510 into the AP state. To recap, when the MTJ cell 510 is in the AP state, the resistance value of the MTJ cell 510 is increased and, moreover, is temperature-dependent. In some embodiments, a second MTJ-based current signal (hereinafter "$I_2$") reflecting such increased and temperature-dependent resistance value is converted by the NMOS transistor 512. When the main switch 518 is turned off, the comparator 542 is enabled, and the MTJ cell circuit 506 may effectively serve as a pull-down circuit and the temperature-code generation circuit 508 may serve as a pull-up circuit. More specifically, the pull-down circuit may be configured to provide a pull-down current signal (e.g., the second MTJ-based current signal $I_2$) with respect to the comparator 542, and the pull-up circuit may be configured to provide a pull-up current signal (e.g., the first MTJ-based current signal $I_1$) with respect to the comparator 542. Because of the increased resistance value (when the MTJ cell 510 is written to the AP state), a current level of the second MTJ-based current signal $I_2$ is lower than that of the first MTJ-based current signal $I_1$, which in turn causes the voltage level at the non-inverting input terminal 542-2 to be pulled up above the substantially stable voltage level at the inverting input terminal 542-1, which is $V_{Rp}$. Accordingly, the output signal 543 of the comparator 542 transitions to HIGH (since the voltage level at 542-2 is higher than that at 542-1).

According to some embodiments of the present disclosure, the thermometer control circuit 502 may compare the pull-up current signal (e.g., $I_1$) and the pull-down current signal (e.g., I2) by toggling the coding switches (532, 534, 536, 538, and 540) to determine when the output signal 543 of the comparator 542 transitions from HIGH to LOW. Upon the output signal 543 transitioning again to LOW, the second temperature code is generated based on the respective toggled behaviors of the coding switches (532, 534, 536, 538, and 540). In some embodiments, the thermometer control circuit 502 may sequentially turn off the coding switches to deactivate respective PMOS transistors, and wait until the output signal 543 transitioning again to LOW. For example, the thermometer control circuit 502 first turns off the coding switch 532 to deactivate the PMOS transistor 522 so as to reduce the pull-up current by about $\frac{1}{5} \times I_1$, and detects whether the output signal 543 transitions to LOW. If yes, the thermometer control circuit 502 provides the second temperature code as 01111. However, if not, the thermometer control circuit 502 iteratively continues turning off the next coding switch (e.g., 534, 536. 538, 540, etc.) to deactivate the respective PMOS transistor so as to further reduce the pull-up current by about $\frac{1}{5} \times I_1$ until the thermometer control circuit 502 detects the output signal 543 transitioning back to LOW. The thermometer control circuit 502 accordingly provides the second temperature code based on the respective toggled behaviors of the coding switches (532, 534, 536, 538, and 540) at the time when the output signal 543 transitions back to LOW.

In some embodiments, the thermometer control circuit 502 uses the second temperature code to estimate a temperature reading based on a pre-calibrated temperature-code (TC) lookup table. Such a TC lookup table may be stored in the computer-readable medium storage of the thermometer control circuit 502. In some embodiments, the TC lookup table is built through performing a series of pre-calibration processes. More specifically, the thermometer circuit 134 is placed under a temperature $T_3$, and the thermometer control circuit 502 follows the above-mentioned operation principle to write the MTJ cell 510 into the AP state and record a respective temperature code, e.g., a third temperature code, that corresponds to the temperature $T_3$; the thermometer circuit 134 is then placed under a temperature $T_4$ (different from $T_3$), and the thermometer control circuit 502 follows the above-mentioned operation principle to generate a fourth temperature code that corresponds to the temperature $T_4$; and so on to build the TC lookup table. The TC lookup table may accordingly comprises a plurality of temperature codes and respective associated temperature (values). In some embodiments, the thermometer control circuit 502 can use those correspondences of temperature codes to respective temperature values in the lookup table to estimate (read out) a current temperature reading by any of a variety of numerical analysis methods such as, for example, an interpolation technique, an extrapolation technique, etc. As such, when the temperature-sensing device 100 (FIG. 1) is placed in a temperature-varying environment or coupled to a system circuit with varying (on-chip) temperatures, the thermometer circuit 134 can estimate a present temperature reading by using the above-described temperature code.

In some alternative embodiments, the thermometer control circuit 502 may build the pre-calibrated TC lookup table based on differences of the first temperature code (that is temperature-independent) and a plurality of temperature codes (that are each temperature-dependent). As such, for example, the thermometer control circuit 502 may compare the first and second temperature codes to deduce a difference between the temperature codes. Accordingly, the thermometer control circuit 502 can use the pre-calibrated TC lookup table and any of a variety of numerical analysis methods to estimate a temperature reading that corresponds to the difference of temperature codes between the temperature-independent and temperature-dependent codes.

Figure 5C:
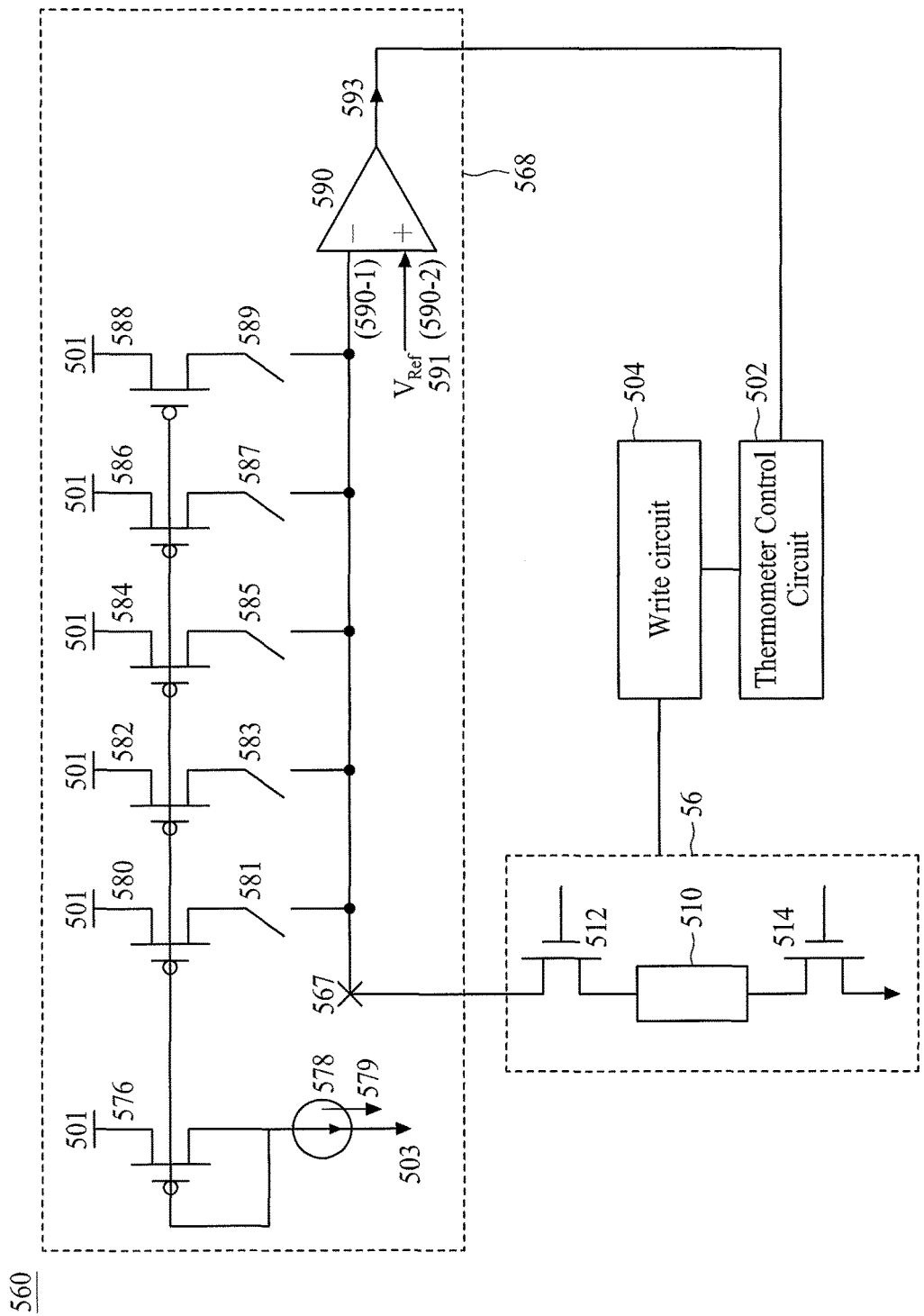
FIG. 5C illustrates a hybrid circuit and block diagram of another embodiment of the thermometer circuit of FIG. 5A, in accordance with some embodiments.

FIG. 5C illustrates a hybrid block and circuit diagram of another exemplary embodiment of the thermometer circuit 134. For clarity, the embodiment of the thermometer circuit 134 in FIG. 5C is herein referred to as thermometer circuit 560. The thermometer circuit 560 is substantially similar to the thermometer circuit 134 (e.g., including the thermometer control circuit 502, the write circuit 504, and the MTJ cell circuit 506) except that the thermometer circuit 560 includes a temperature-code generation circuit 568 configured to use a current source 578 to provide a constant current signal 579, and generate temperature code(s) based on the constant current signal 579. As such, the following discussions will be focused on the temperature-code generation circuit 568.

In some embodiments, similar to the temperature-code generation circuit 508 (FIG. 5B), the temperature-code generation circuit 568 includes a plurality of PMOS transistors (580, 582, 584, 586, 588, etc.) that are each coupled to the MTJ cell circuit 566 by a respective coding switch, and the supply voltage 501. As illustrated, the PMOS transistor 580 is coupled to the MTJ cell circuit 566 by coding switch 581; the PMOS transistor 582 is coupled to the MTJ cell circuit 566 by coding switch 583; the PMOS transistor 584 is coupled to the MTJ cell circuit 566 by coding switch 585; the PMOS transistor 586 is coupled to the MTJ cell circuit 566 by coding switch 587; and the PMOS transistor 588 is coupled to the MTJ cell circuit 566 by coding switch 589. When each of the coding switches (581, 583, 585, 587, 589, etc.) is turned on, the respective PMOS transistor (580, 582, 584, 586, 588, etc.) is coupled to the MTJ circuit 566 at a common node 567. This common node 567 is coupled to an inverting input terminal 590-1 of a comparator 590, while the comparator 590's non-inverting input terminal 590-2 is coupled to a supply voltage 591 having a substantially fixed voltage level, $V_{ref}$.

Different from the temperature-code generation circuit 508, the temperature-code generation circuit 568 further includes a PMOS transistor 576 coupled to the current source 578. The PMOS transistor 576 is coupled between the supply voltage 501 and the current source 578, and is configured to be diode-connected (i.e., gate and drain ends are tied together). More specifically, gate ends of the PMOS transistors (576, 580, 582, 584, 586, and 588) are coupled to one another so as the PMOS transistor 576 may mirror the constant current signal 579 to each of the PMOS transistors (580, 582, 584, 586, and 588).

Operations of the thermometer circuit 560 are substantially similar to the above-discussed operations of the thermometer circuit 134. Thus, the operations of the thermometer circuit 560 are briefly described as follows. Initially, the coding switches (581, 583, 585, 587, and 589) are turned on so that each PMOS transistor (580, 582, 584, 586, and 588) may be provided (mirrored) with the constant current signal 579. Alternatively stated, the constant current signal 579 flows through each PMOS transistor (580, 582, 584, 586, and 588). In some embodiments, $V_{ref}$ is pre-selected so as to cause an output signal 593 of the comparator 590 to be LOW (i.e., a voltage level at the inverting input terminal 590-1 is larger than $V_{ref}$).

Subsequently, the thermometer control circuit 502 causes the write circuit 504 to write the MTJ cell 510 into the P state, which allows the transistor 512 to convert the temperature-independent resistance value of the MTJ cell 510 to an MTJ-based current signal (hereinafter "$I_3$"). And, in some embodiments, such an MTJ-based current signal $I_3$ is provided to the temperature-code generation circuit 568 to be compared with the constant current signal 579. Similar to the above discussion with respect to the thermometer circuit 134, the constant current signal 579 flowing through each PMOS transistor (580, 582, 584, 586, or 588) and the MTJ-based current signal $I_3$ serve as a pull-up current signal and a pull-down current signal, respectively. When the MTJ-based current signal $I_3$ is provided, in some embodiments, the output signal 593 may be pulled to HIGH (since the voltage level at 590-1 is pulled down below $V_{ref}$). The thermometer control circuit 502 then sequentially toggles the coding switches (581, 583, 585, 587, and 589) until the output signal 593 transitions back to LOW. Accordingly, the thermometer control circuit 502 stores such toggled behaviors of the respective coding switches (581, 583, 585, 587, and 589) in its computer-readable medium storage as a temperature code "T_P."

In some embodiments, the thermometer control circuit 502 causes the write circuit 504 to write the MTJ cell 510 into the AP state, which allows the transistor 512 to convert the temperature-dependent resistance value of the MTJ cell 510 to another MTJ-based current signal (hereinafter "$I_4$"). Such an MTJ-based current signal $I_4$ is then provided to the temperature-code generation circuit 568 to be compared with the constant current signal 579. Similarly, the output signal 593 is pulled to HIGH again (by the pull-down current signal $I_4$). The thermometer control circuit 502 sequentially toggles the coding switches (581, 583, 585, 587, and 589) until the output signal 593 transitions back to LOW. Accordingly, the thermometer control circuit 502 stores such toggled behaviors of the respective coding switches (581, 583, 585, 587, and 589) in its computer-readable medium storage as a temperature code "T_AP." The thermometer control circuit 502 calculate a difference between the temperature codes T_P and T_AP, and uses the difference to estimate a temperature value based on a pre-calibrated lookup table similar to the one described above with respect to the thermometer circuit 134 of FIG. 5B.

Figure 5D:
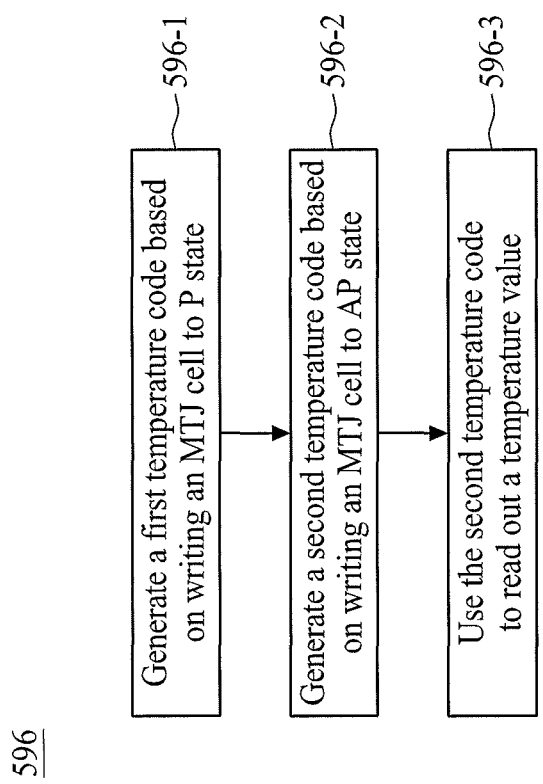
FIG. 5D illustrates a flow chart of an exemplary method to operate the thermometer circuit of FIG. 5B, in accordance with some embodiments.

FIG. 5D illustrates a flow chart of an exemplary method 596 to operate the thermometer circuit 134 of FIG. 5B, in accordance with various embodiments. Operations of the method 596 are performed by the respective components illustrated in FIGS. 5A-5B. For purposes of discussion, the following embodiment of the method 596 will be described in conjunction with FIGS. 5A-5B. The illustrated embodiment of the method 596 is merely an example. Therefore, it should be understood that any of a variety of operations may be omitted, re-sequenced, and/or added while remaining within the scope of the present disclosure. Further, it should be understood that the method 596 can also be used to operate the thermometer circuit 560 of FIG. 5C while remaining within the scope of the present disclosure.

The method 596 starts with operation 596-1 in which a first temperature code that corresponds to a resistance value of an MTJ cell (e.g., 510 of FIG. 5B) being written in the P state is generated, in accordance with various embodiments. When the MTJ cell 510 is in the P state, its resistance value is temperature-independent. By using the transistor 512 biased at a substantially fixed voltage level, a first MTJ-based current signal (e.g., $I_1$) reflecting such a temperature-independent resistance value is accordingly generated. Further, by turning on the main switch 518 and all the coding switches (532, 534, 536, 538, and 540), the first MTJ-based current signal $I_1$ is sampled (represented) by the PMOS transistors (522, 524, 526, 528, and 530), and is stored as electric charges in the capacitor 516. In some embodiments, each PMOS transistor is conducted to flow about ⅕ $\lambda I_1$. In some embodiments, the first temperature code is present by the respective toggled behaviors of the coding switches (532, 534, 536, 538, and 540), which is 11111, wherein "1" represents that the respective coding switch is turned on, and "0" represents that the respective coding switch is turned off.

The method 596 continues to operation 596-2 in which a second temperature code that corresponds to a resistance value of the MTJ cell 510 being written in the AP state is generated, in accordance with various embodiments. When the MTJ cell 510 is in the AP state, its resistance value is temperature-dependent. By using the transistor 512 biased at a substantially fixed voltage level, an MTJ-based current signal (e.g., $I_2$) reflecting such a temperature-dependent resistance value is accordingly generated. In some embodiments, prior to or simultaneously with the MTJ cell 510 being written to the AP state, the main switch 518 is turned off. As such, the first MTJ-based current signal $I_1$ and the second MTJ-based current signal $I_2$ may be compared by the comparator 542 until the output signal 543 of the comparator 542 transitions to LOW. In some embodiments, the above-mentioned comparison process may be performed by sequentially turning off the coding switches (532, 534, 536, 538, and 540). Upon the output signal transitioning to LOW, the present toggled behaviors of the coding switches (532, 534, 536, 538, and 540) are used as the second temperature code, e.g., 00011.

The method 596 continues to operation 596-3 in which the second temperature code is used to estimate a current temperature value, in accordance with various embodiments. Since the second MTJ-based current signal $I_2$ reflects the temperature-dependent resistance value of the MTJ cell 510, the second temperature code can be used to reflect a current temperature value. In some embodiments, the second temperature code may be used to project or find a corresponding temperature value in a pre-calibrated lookup table. Such a pre-calibrated lookup table may include a plurality of temperature codes and each temperature code's corresponding temperature value.

Figure 6:
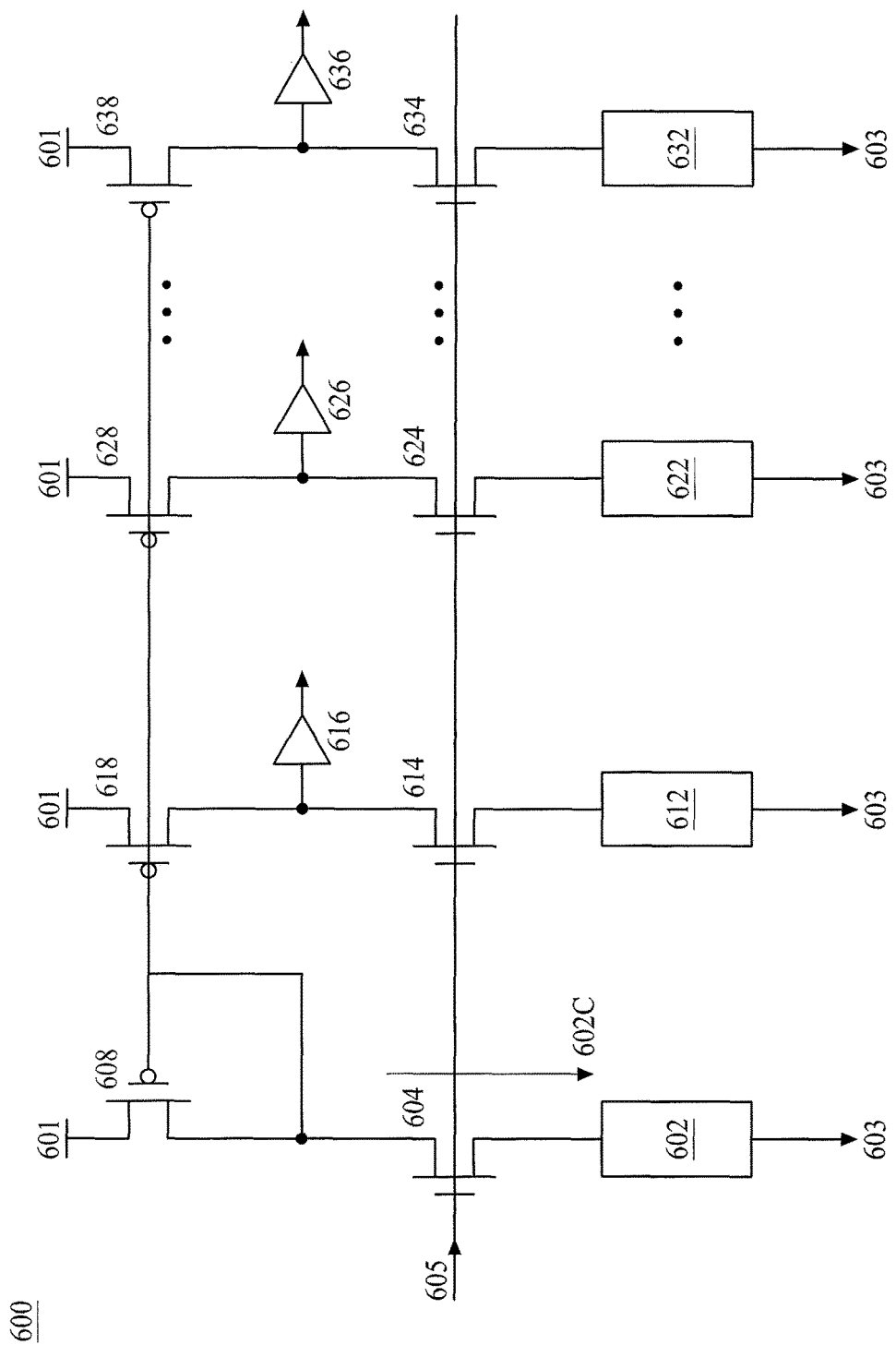
FIG. 6 illustrates a circuit diagram of another embodiment of the thermometer circuit of FIG. 5A, in accordance with some embodiments.

FIG. 6 illustrates a circuit diagram of yet another exemplary embodiment of the thermometer circuit 134 (FIG. 1). For clarity, the embodiment of the thermometer circuit 134 in FIG. 6 is herein referred to as thermometer circuit 600. In some embodiments, the thermometer circuit 600 includes plural MTJ cells, each of which has a respective cross-sectional area and is written to the AP state. As discussed with respect to FIG. 3B, an MTJ cell's resistance value is inversely proportional to its respective cross-sectional area. By utilizing such a correlation (between the resistance value and the respective cross-sectional area) and the temperature dependence of the resistance value, the thermometer circuit 600 can be used to estimate a temperature reading, in accordance with some embodiments.

As shown in the illustrated embodiment of FIG. 6, the thermometer circuit 600 includes a reference MTJ cell 602 and a plurality of thermometer MTJ cells (612, 622, 632, etc.). The reference MTJ cell 602 is serially coupled to a diode-connected PMOS transistor 608 by a clamp transistor 604, which may be an NMOS transistor. Such serially coupled reference MTJ cell 602, clamp transistor 604, and the diode-connected PMOS transistor 608 are coupled between a first supply voltage 601 (e.g., Vdd) and a second supply voltage 603 (e.g., ground). Each thermometer MTJ cells (612, 622, 632, etc.) is coupled to a respective thermometer PMOS transistor (618, 628, 638, etc.) by a respective clamp transistor (614, 624, 634, etc.), which may be an NMOS transistor. Similarly, such serially coupled thermometer MTJ cells (614, 624, 634, etc.), clamp transistors (614, 624, 634, etc.), and the thermometer PMOS transistors (618, 628, 638, etc.) are respectively coupled between Vdd (601) and ground (603). The clamp transistors (604, 614, 624, 634, etc.) are all gated by a voltage signal 605 with a substantially fixed voltage level. A gate end of the diode-connected PMOS transistor 608 and gate ends of the thermometer PMOS transistors (618, 628, 638, etc.) are all coupled to one another. As such, each thermometer PMOS transistor (618, 628, 638, etc.), together with the diode-connected PMOS transistor 608, may be respectively formed as a current mirror configured to mirror a reference current, which will be discussed in further detail below. Moreover, each thermometer PMOS transistor (618, 628, 638, etc.) is coupled to a respective buffer (616, 626, 636, etc.).

In some embodiments, the reference MTJ cell 602 is written into the P state, and each thermometer MTJ cell (612, 622, 632, etc.) is written into the AP state, which causes the reference MTJ cell 602 to have a temperature-independent resistance value, and each thermometer MTJ cell (612, 622, 632, etc.) to have a temperature-dependent resistance value, respectively. Moreover, in some embodiments, the thermometer MTJ cells (612, 622, 632, etc.) are each formed with a respective different cross-sectional area. For example, the thermometer MTJ cell 612 is formed as having a cross-sectional area 612A; the thermometer MTJ cell 622 is formed as having a cross-sectional area 622A; the thermometer MTJ cell 632 is formed as having a cross-sectional area 632A. And, in some embodiments, the cross-sectional areas of the thermometer MTJ cells may be selected to be incrementally decreased (e.g., 612A>622A>632A) so as to allow each thermometer MTJ cell to be corresponding to a respective thermometer value (e.g., a pre-calibrated temperature reading).

More specifically, in some embodiments, the cross-sectional areas of the thermometer MTJ cells are further selected to cause each thermometer MTJ cell to present a common resistance value ($R_{AP}$) under a respective thermometer value. That is, for example, when the MTJ cell 612 is placed under a temperature $T_1$ (a first thermometer value), the cross-sectional area 612A is selected to cause the temperature-dependent resistance value of the MTJ cell 612 to be equal to $R_{AP}$; when the MTJ cell 622 is placed under a temperature $T_2$ (a second thermometer value), the cross-sectional area 622A is selected to cause the temperature-dependent resistance value of the MTJ cell 622 to be equal to $R_{AP}$; when the MTJ cell 632 is placed under a temperature $T_3$ (a third thermometer value), the cross-sectional area 632A is selected to cause the temperature-dependent resistance value of the MTJ cell 632 to be equal to $R_{AP}$. In the above example where 612A>622A>632A, the first, second, and third thermometer values may be incrementally increased, i.e., $T_1<T_2<T_3$. In some embodiments, the thermometer values ($T_1$, $T_2$, and $T_3$) associated with the thermometer MTJ cells (614, 624, 634), respectively, can be used by the thermometer circuit 600 to estimate a temperature reading of an on-chip temperature, which will be discussed in further detail as follows.

As mentioned above, the reference MTJ cell 602 is written in the P state, which causes the reference MTJ cell 602 to have a temperature-independent resistance value. Such a temperature-independent resistance value is converted into a current signal 602C (that is also temperature-independent). In some embodiments, the current signal 602C is converted by the clamp transistor 604, which is similar to the NMOS transistors 512 of FIGS. 5B and 5C. Once the current signal 602C is provided, the current signal 602C can be mirrored to the thermometer PMOS transistors (618, 628, 638, etc.) by the diode-connected PMOS transistor 608 when each thermometer PMOS transistor's serially coupled thermometer MTJ cell is conducted. In some embodiments, the thermometer MTJ cell may become conducted when an environmental temperature of the thermometer circuit 600 (or an on-chip temperature being monitored by the thermometer circuit 600) reaches or exceeds the respective associated thermometer value. If the current signal 602C is mirrored to the thermometer PMOS transistor, each thermometer PMOS transistor's serially coupled buffer (616, 626, 636, etc.) may output a logical "1" (i.e., HIGH). When the thermometer circuit 600 outputs more 1's, the thermometer circuit 600 may determine that a higher on-chip temperature has been detected (since the thermometer values ($T_1$, $T_2$, $T_3$, etc.) are incrementally increased). Moreover, a temperature reading of the on-chip temperature can also be estimated by the thermometer circuit 600 by using the output logical states of the buffers (616, 626, 636, etc.).

For example, when an on-chip temperature is $T_x$ that is between $T_2$ and $T_3$ (i.e., $T_1<T_2<T_x<T_3$), the thermometer MTJ cells 612 and 622 are conducted, and the thermometer MTJ cell 632 is not conducted. Accordingly, the buffer 616, coupled to the conducted thermometer MTJ cell 612, outputs an 1; the buffer 626, coupled to the conducted thermometer MTJ cell 622, outputs an 1; the buffer 636, coupled to the conducted thermometer MTJ cell 632, outputs a 0. As such, the thermometer circuit 600 can estimate the reading of the on-chip temperature $T_x$ is between about $T_2$ and $T_3$.

In an embodiment, a thermometer circuit configured to estimate a monitored temperature is disclosed. The circuit includes an adjustable resistor presenting a first resistance value that is temperature-independent and a second resistance value that is temperature-dependent, wherein a first current signal is conducted across the resistor when it presents the first resistance value and a second current signal is conducted across the resistor when it presents the second resistance value; a plurality of gated conductors coupled to the resistor; and a control circuit, coupled to the resistor and the plurality of gated conductors, and configured to selectively deactivate at least one of the plurality of gated conductors to compare the first and second current signals to estimate the monitored temperature.

In another embodiment, a thermometer circuit configured to estimate a monitored temperature includes a magnetic tunnel junction (MTJ) cell presenting a first resistance value that is temperature-independent and a second resistance value that is temperature-dependent, wherein a first current signal is conducted across the MTJ cell when it presents the first resistance value and a second current signal is conducted across the MTJ cell when it presents the second resistance value; a plurality of gated conductors coupled to the MTJ cell; and a control circuit, coupled to the MTJ cell and the plurality of gated conductors, and configured to selectively deactivate at least one of the plurality of gated conductors to compare the first and second current signals to estimate the monitored temperature.

Yet in another embodiment, a method for estimating a monitored temperature includes providing a first current signal, wherein the first current signal is conducted across a magnetic tunnel junction (MTJ) cell when it presents a temperature-independent resistance value; generating a first temperature code by turning on a plurality of coding switches, wherein the first temperature code reflects the first current signal; providing a second current signal, wherein the second current signal is conducted across the MTJ cell when it presents a temperature-dependent resistance value; comparing the first and second current signals by iteratively turning off one of the plurality of coding switches thereby generating a second temperature code, wherein the second temperature code reflects the second current signal; and estimating the monitored temperature based on the second temperature code.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A thermometer circuit configured to estimate a monitored temperature, comprising:
    an adjustable resistor presenting a first resistance value that is temperature-independent and a second resistance value that is temperature-dependent, wherein a first current signal is conducted across the resistor when it presents the first resistance value and a second current signal is conducted across the resistor when it presents the second resistance value;
    a plurality of gated conductors coupled to the resistor; and
    a control circuit, coupled to the resistor and the plurality of gated conductors, and configured to selectively deactivate at least one of the plurality of gated conductors to compare the first and second current signals to estimate the monitored temperature, wherein when the first current signal is generated, gate terminals of the plurality of gated conductors are electrically coupled to the resistor and when the second current signal is generated, the gate terminals of the plurality of gated conductors are electrically decoupled from the resistor.

2. The circuit of claim 1, wherein the resistor includes a magnetic tunnel junction (MTJ) cell.

3. The circuit of claim 2, wherein the resistor presents the first resistance value when the MTJ cell is in a parallel state, and the resistor presents the second resistance value when the MTJ cell is in an anti-parallel state.

4. The circuit of claim 1, further comprising:
a comparator coupled to the plurality of gated conductors and the resistor; and
a plurality of switches, wherein each switch is coupled between the resistor and a respective gated conductor, and wherein each switch is turned off to deactivate the respective gated conductor.

5. The circuit of claim 4, wherein the first current signal is stored by a capacitor coupled to the gate terminals of the plurality of gated conductors.

6. The circuit of claim 5, wherein when the first current signal is generated, the plurality of switches are turned on so as to cause the first current signal to be distributed by the plurality of gated conductors.

7. The circuit of claim 4, wherein the gate terminals of the plurality of gated conductors are electrically coupled to an inverting input terminal of the comparator, and the resistor is electrically coupled to a non-inverting input terminal of the comparator.

8. The circuit of claim 7, wherein when the second current signal is generated, the control circuit is configured to iteratively toggle one of the plurality of switches to deactivate the respective gated conductor until the comparator outputs a logical low value.

9. The circuit of claim 8, wherein when the comparator outputs the logical low value, the control circuit estimates the reading of the monitored temperature based on toggled behaviors of the plurality of switches.

10. The circuit of claim 1, wherein each gated conductor includes a p-type metal-oxide-semiconductor (PMOS) transistor.

11. A thermometer circuit configured to estimate a monitored temperature, comprising:
a magnetic tunnel junction (MTJ) cell presenting a first resistance value that is temperature-independent and a second resistance value that is temperature-dependent, wherein a first current signal is conducted across the MTJ cell when it presents the first resistance value and a second current signal is conducted across the MTJ cell when it presents the second resistance value;
a plurality of gated conductors coupled to the MTJ cell; and
a control circuit, coupled to the MTJ cell and the plurality of gated conductors, and configured to selectively deactivate at least one of the plurality of gated conductors to compare the first and second current signals to estimate the monitored temperature, wherein when the first current signal is generated, gate terminals of the plurality of gated conductors are electrically coupled to the MTJ cell and when the second current signal is generated, the gate terminals of the plurality of gated conductors are electrically decoupled from the MTJ cell.

12. The circuit of claim 11, wherein the MTJ cell presents the first resistance value when the MTJ cell is in a parallel state, and the MTJ cell presents the second resistance value when the MTJ cell is in an anti-parallel state.

13. The circuit of claim 11, further comprising:
a comparator coupled to the plurality of gated conductors and the MTJ cell; and
a plurality of switches, wherein each switch is coupled between the MTJ cell and a respective gated conductor, and wherein each switch is turned off to deactivate the respective gated conductor.

14. The circuit of claim 13, wherein the first current signal is stored by a capacitor coupled to the gate terminals of the plurality of gated conductors.

15. The circuit of claim 14, wherein when the first current signal is generated, the plurality of switches are turned on so as to cause the first current signal to be distributed by the plurality of gated conductors.

16. The circuit of claim 13, wherein the gate terminals of the plurality of gated conductors are electrically coupled to an inverting input terminal of the comparator, and the MTJ cell is electrically coupled to a non-inverting input terminal of the comparator.

17. The circuit of claim 16, wherein when the second current signal is generated, the control circuit is configured to iteratively toggle one of the plurality of switches to deactivate the respective gated conductor until the comparator outputs a logical low value.

18. A method for estimating a monitored temperature, comprising:
providing a first current signal, wherein the first current signal is conducted across a magnetic tunnel junction (MTJ) cell when it presents a temperature-independent resistance value, wherein when the first current signal is provided, gate terminals of the plurality of gated conductors are electrically coupled to the MTJ cell;
generating a first temperature code by turning on a plurality of coding switches configured to electrically couple and decouple respective ones of the plurality of gated conductors to the MTJ cell, wherein the first temperature code reflects the first current signal;
providing a second current signal, wherein the second current signal is conducted across the MTJ cell when it presents a temperature-dependent resistance value, wherein when the second current signal is provided, the gate terminals of the plurality of gated conductors are electrically decoupled from the MTJ cell;
comparing the first and second current signals by iteratively turning off one of the plurality of coding switches thereby generating a second temperature code, wherein the second temperature code reflects the second current signal; and
estimating the monitored temperature based on the second temperature code.

* * * * *